(12) United States Patent
Kawashima

(10) Patent No.: US 11,430,717 B2
(45) Date of Patent: Aug. 30, 2022

(54) SEMICONDUCTOR DEVICE

(71) Applicant: DENSO CORPORATION, Kariya (JP)

(72) Inventor: Takanori Kawashima, Anjo (JP)

(73) Assignee: DENSO CORPORATION, Kariya (JP)

( * ) Notice: Subject to any disclaimer, the term of this patent is extended or adjusted under 35 U.S.C. 154(b) by 59 days.

(21) Appl. No.: 16/863,222

(22) Filed: Apr. 30, 2020

(65) Prior Publication Data
US 2020/0365491 A1 Nov. 19, 2020

(30) Foreign Application Priority Data
May 15, 2019 (JP) .............................. JP2019-092427

(51) Int. Cl.
*H01L 23/492* (2006.01)
*H01L 23/31* (2006.01)

(52) U.S. Cl.
CPC ........ *H01L 23/492* (2013.01); *H01L 23/3121* (2013.01)

(58) Field of Classification Search
CPC ............. H01L 23/3107; H01L 23/3121; H01L 23/492; H01L 23/49513; H01L 23/49541; H01L 23/49562; H01L 23/49575
See application file for complete search history.

(56) References Cited

U.S. PATENT DOCUMENTS

| | | | |
|---|---|---|---|
| 6,697,257 B1* | 2/2004 | Wolf | H01L 23/5385 361/708 |
| 2004/0089934 A1* | 5/2004 | Shimoida | H01L 25/071 257/686 |
| 2007/0040260 A1* | 2/2007 | Otremba | H01L 24/41 257/686 |
| 2007/0132079 A1* | 6/2007 | Otremba | H01L 23/3107 257/685 |

FOREIGN PATENT DOCUMENTS

| | | |
|---|---|---|
| JP | 2014-130894 A | 7/2014 |
| JP | 2015-530748 A | 10/2015 |
| JP | 2016-036047 A | 3/2016 |
| WO | 2014/039658 A1 | 3/2014 |

* cited by examiner

*Primary Examiner* — Allan R Wilson
(74) *Attorney, Agent, or Firm* — Sughrue Mion, PLLC

(57) ABSTRACT

A semiconductor device may include: an upper conductive plate, a middle conductive plate, and a lower conductive plate that are stacked on each other; a first semiconductor chip located between the upper conductive plate and the middle conductive plate and electrically connected to both the upper conductive plate and the middle conductive plate; and a second semiconductor chip located between the middle conductive plate and the lower conductive plate and electrically connected to both the middle conductive plate and the lower conductive plate, wherein one of an area of the upper conductive plate and an are of the lower conductive plate may be smaller than an area of the middle conductive plate, and another of the area of the upper conductive plate and the area of the lower conductive plate may be larger than the area of the middle conductive plate.

6 Claims, 25 Drawing Sheets

SEMICONDUCTOR DEVICE

CROSS-REFERENCE TO RELATED APPLICATION

This application claim priority to Japanese Patent Application No. 2019-092427, fled on May 15, 2019, contents of which are incorporated herein by reference.

TECHNICAL FIELD

The technology disclosed herein relates to a semiconductor device.

BACKGROUND

Japanese Patent Application Publication No. 2016-36047 describes a semiconductor device. This semiconductor device is provided with an upper conductive plate, a middle conductive plate, and a lower conductive plate stacked on each other, a first semiconductor chip located between the upper conductive plate and the middle conductive plate, a second semiconductor chip located between the middle conductive plate and the lower conductive plate, and an encapsulant encapsulating the first and second semiconductor chips and integrally holding the upper, middle, and lower conductive plates.

SUMMARY

When the aforementioned semiconductor device is to be manufactured, the aforementioned three conductive plates need to be joined via the semiconductor chips. In order to manufacture the semiconductor device with high precision, the three conductive plates need to be positioned correctly by using jigs, for example. However, due to a need of removal afterward, it is difficult to hold the three conductive plates stacked on each other by a single jig. As such, consideration may be given to using a jig configured to separate into two or more, however, use of such plural jig parts may bring forth deterioration in dimensional precision as compared to using a single jig.

The description herein provides a structure configured to allow high-precision manufacture of a semiconductor device in which three or more conductive plates are stacked.

The technology disclosed herein is embodied in a semiconductor device. The semiconductor device may comprise: an upper conductive plate, a middle conductive plate, and a lower conductive plate that are stacked on each other; a first semiconductor chip located between the upper conductive plate and the middle conductive plate and electrically connected to both the upper conductive plate and the middle conductive plate; and a second semiconductor chip located between the middle conductive plate and the lower conductive plate and electrically connected to both the middle conductive plate and the lower conductive plate, wherein, in a plan view along a stacking direction, one of an area of the upper conductive plate and an area of the lower conductive plate may be smaller than an area of the middle conductive plate, and another of the area of the upper conductive plate and the area of the lower conductive plate may be larger than the area of the middle conductive plate.

The technology disclosed herein is embodied in a following semiconductor device. The semiconductor device may comprise: an upper conductive plate, a middle conductive plate, and a lower conductive plate that are stacked on each other; a first semiconductor chip located between the upper conductive plate and the middle conductive plate and electrically connected to both the upper conductive plate and the middle conductive plate; and a second semiconductor chip located between the middle conductive plate and the lower conductive plate and electrically connected to both the middle conductive plate and the lower conductive plate, wherein when the upper conductive plate, the middle conductive plate, and the lower conductive plate are projected on a plane parallel to the upper conductive plate, the middle conductive plate, and the lower conductive plate, at least a first region, a second region, and a third region may be defined on the plane, the first region may be a region in which three plates being the upper conductive plate, the middle conductive plate, and the lower conductive plate are projected, the second region may be a region in which only two plates being the middle conductive plate and one of the upper conductive plate and the lower conductive plate are projected, and the third region may be a region in which only another of the upper conductive plate and the lower conductive plate is projected.

BRIEF DESCRIPTION OF DRAWINGS

FIG. 10a shows a vertical view (plan view) of the upper conductive plate 16, FIG. 10b shows a vertical view (plan view) of the middle conductive plate 20, and FIG. 10c shows a vertical view (plan view) of the lower conductive plate 18.

DETAILED DESCRIPTION

Figure 1:
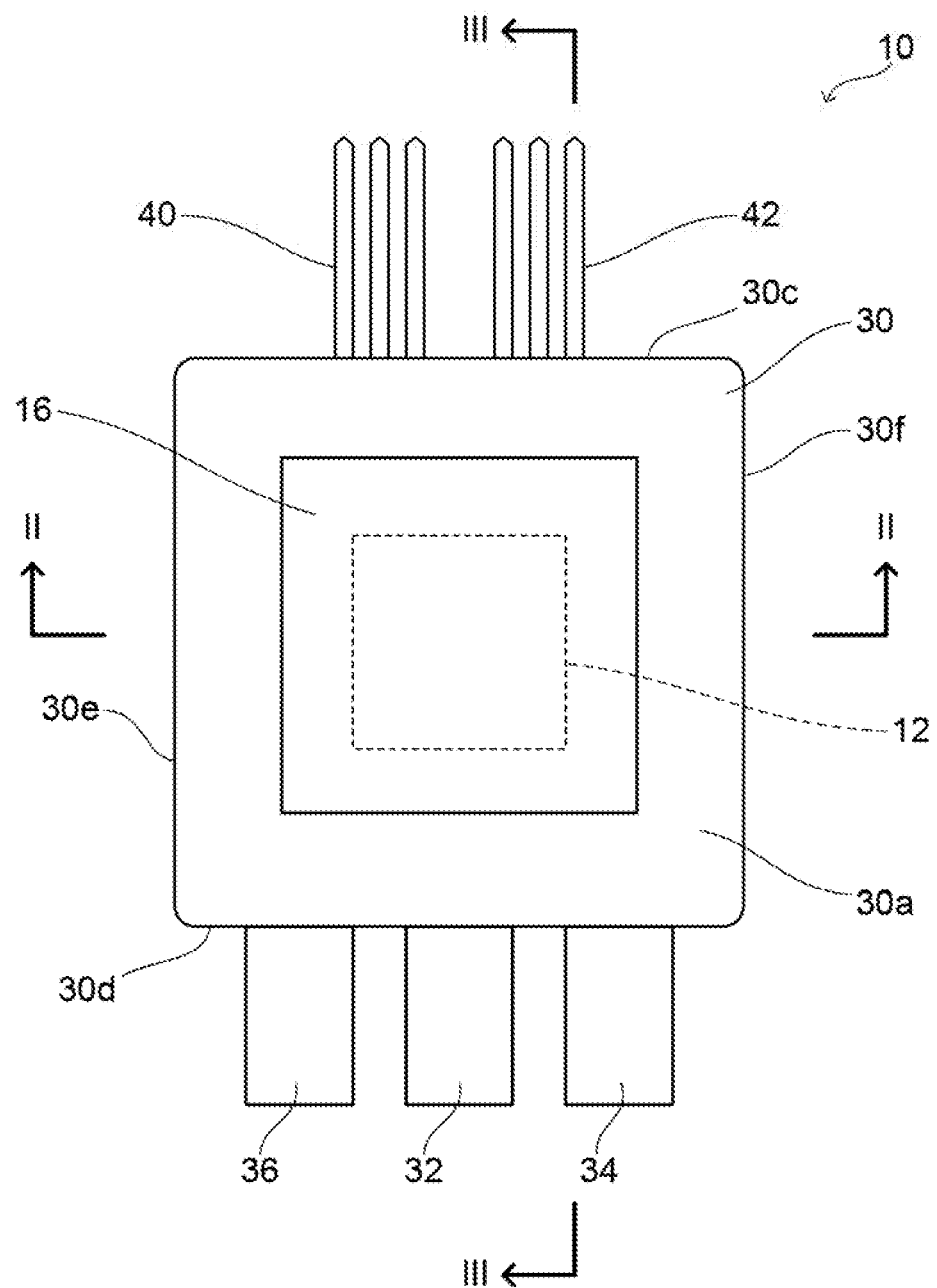
FIG. 1 shows an outer appearance of a semiconductor device 10 of an embodiment.
Figure 2:
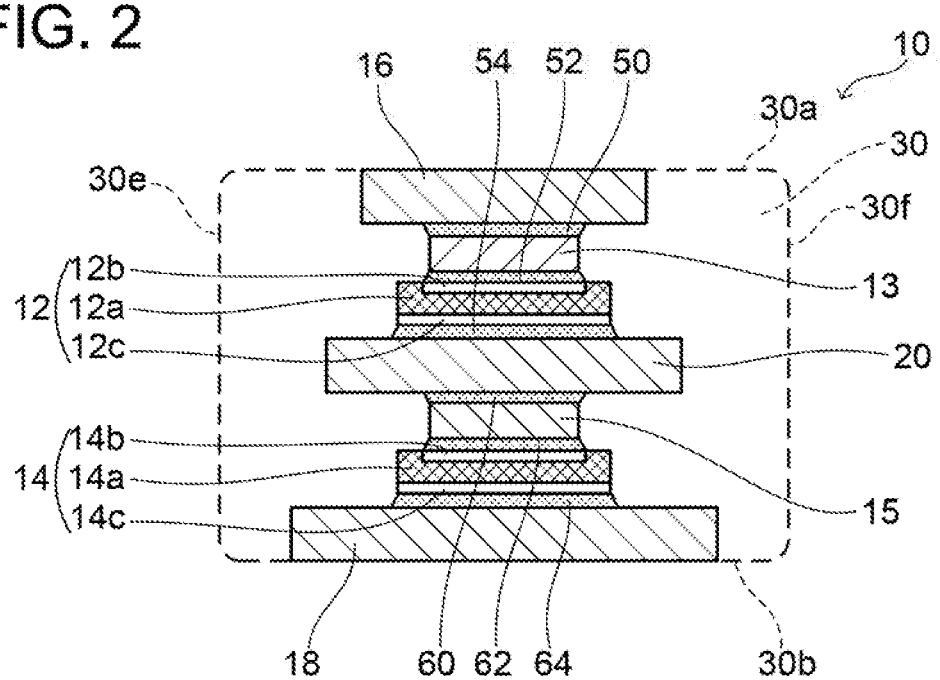
FIG. 2 shows a cross-sectional view along a line II-II of FIG. 1.
Figure 3:
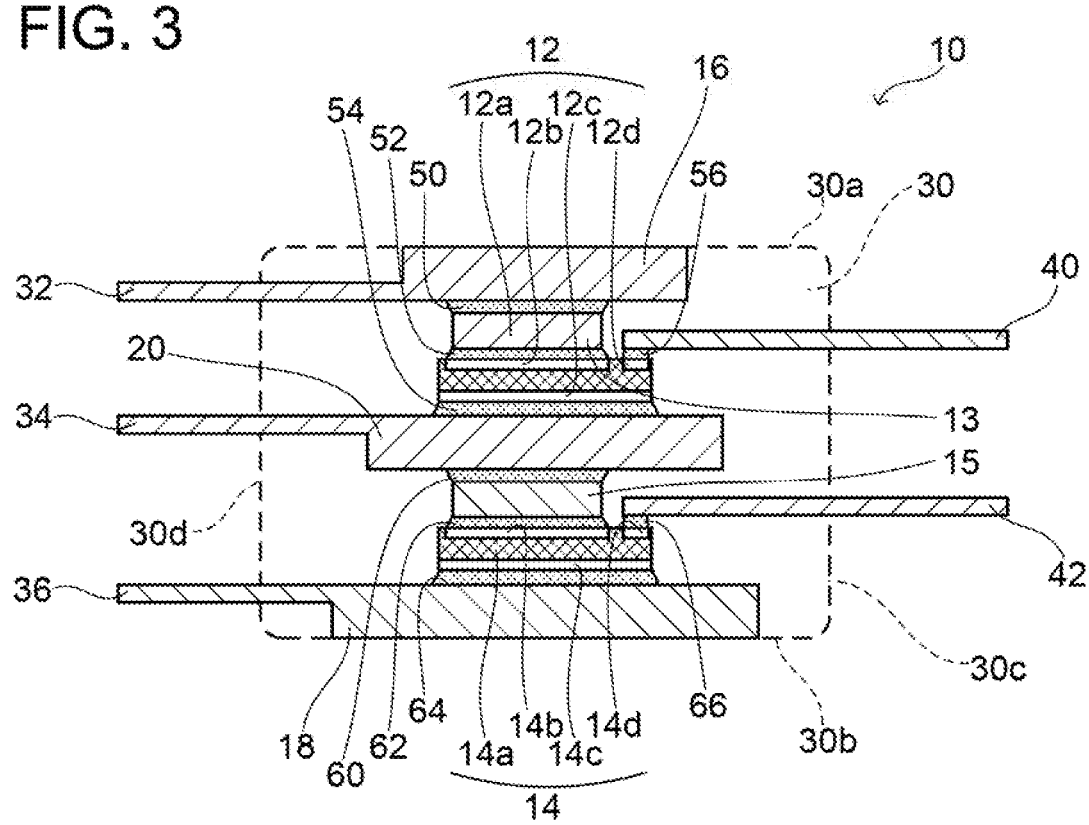
FIG. 3 shows a cross-sectional view along a line III-III of FIG. 1.

In an aspect of the present technology, a semiconductor device may comprise: an upper conductive plate, a middle conductive plate, and a lower conductive plate that are stacked on each other; a first semiconductor chip located between the upper conductive plate and the middle conductive plate and electrically connected to both the upper conductive plate and the middle conductive plate; and a second semiconductor chip located between the middle conductive plate and the lower conductive plate and electrically connected to both the middle conductive plate and the lower conductive plate, wherein, in a plan view along a stacking direction, one of an area of the upper conductive plate and an area of the lower conductive plate may be smaller than an area of the middle conductive plate, and another of the area of the upper conductive plate and the area of the lower conductive plate may be larger than the area of the middle conductive plate.

In the aforementioned semiconductor device, the areas of the three conductive plates increase (or decrease) gradually along their sacking direction. According to such a configuration, the three conductive plates stacked on each other can be held in a same direction by a single jig in manufacturing the semiconductor device. The semiconductor device can be manufactured with high precision by using the single jig.

Here, an area of a conductive plate in the description herein (that is, each of the areas of the upper conductive plate, the middle conductive plate, and the lower conductive plate) means an area that is seen along a vertical direction relative to the conductive plate. In other words, the area of the conductive plate means a projected area that can be seen when the conductive plate is projected onto a plane parallel thereto.

In an aspect of the present technology, each of the first semiconductor chip and the second semiconductor chip may comprise a first main electrode, and a second main electrode which has a larger area than the first main electrode. The first semiconductor chip may be connected to the upper conductive plate by the first main electrode and may be connected to the middle conductive plate by the second main electrode. The second semiconductor chip may be connected to the middle conductive plate by the first main electrode and may be connected to the lower conductive plate by the second main electrode. In other words, in each of the first semiconductor chip and the second semiconductor chip, the first main electrode may be located on the opposite side with respect to the second main electrode.

When the area of the second main electrode is larger than the area of the first main electrode in each semiconductor chip, heat is dissipated at a larger quantity through the second main electrode than through the first main electrode. As such, a consideration may be given to improving a heat dissipating performance of the conductive plates connected to the second main electrode by increasing areas of the conductive plates connected to the second main electrode than areas of the conductive plates connected to the first main electrode. Based on such a concept, in the aforementioned embodiment, the area of the upper conductive plate may be smaller than the area of the middle conductive plate and the area of the lower conductive plate may be larger than the area of the middle conductive plate.

Alternatively, when the area of the second main electrode is larger than the area of the first main electrode in each semiconductor chip, the heat dissipating performance of the first main electrode can be said as being inferior to the beat dissipating performance of the second main electrode. As such, a temperature in each of the first main electrodes may become higher than a temperature in each of the second main electrodes when the respective semiconductor chips generate heat by electrical conduction. To suppress such temperature differences, consideration may be given to increasing the areas of the conductive plates connected to the first main electrode larger than the areas of the conductive plates connected to the second main electrode to increase the heat dissipating performance of the conductive plates connected to the first main electrode. Based on such a concept, in the aforementioned embodiment, the area of the upper conductive plate may be larger than the area of the middle conductive plate and the rea of the lower conductive plate may be smaller than the area of the middle conductive plate.

In an aspect of the present technology, each of the first semiconductor chip and the second semiconductor chip may further include a protection film provided in a frame-like shape along an edge of its first main electrode. According to such a configuration, distortion caused by thermal deformation tends to increase locally in a vicinity of each protection film due to different types of materials having different linear expansion coefficients being gathered at such a location. It is effective to suppress a temperature rise in the first main electrodes to suppress increase of such distortion, and in order to do so, consideration may be given to increasing the heat dissipating performance of the conductive plates connected to each first main electrode. In regard to this point, the temperature rise in each first main electrode can effectively be suppressed when the area of the upper conductive plate is larger than the area of the middle conductive plate and the area of the lower conductive plate is smaller than the area of the middle conductive plate.

In an aspect of the present technology, a thickness of one of the upper conductive plate and the lower conductive plate that has the smaller area may be larger than a thickness of another of the upper conductive plate and the lower conductive plate that has the larger area. According to such a configuration, a thermal capacity difference between the upper conductive plate and the lower conductive plate becomes smaller, and a temperature difference that may occur between the first semiconductor chip and the second semiconductor chip can be reduced.

In an aspect of the present technology, the semiconductor device may further comprise an encapsulant encapsulating the first semiconductor chip and the second semiconductor chip and integrally holding the upper conductive plate, the middle conductive plate, and the lower conductive plate together.

In an aspect of the present technology, a semiconductor device may comprise: an upper conductive plate, a middle conductive plate, and a lower conductive plate that are stacked on each other; a first semiconductor chip located between the upper conductive plate and the middle conductive plate and electrically connected to both the upper conductive plate and the middle conductive plate; and a second semiconductor chip located between the middle conductive plate and the lower conductive plate and electrically connected to both the middle conductive plate and the lower conductive plate, wherein when the upper conductive plate, the middle conductive plate, and the lower conductive plate are projected on a plane parallel to the upper conductive plate, the middle conductive plate, and the lower conductive plate, at least a first region, a second region, and a third region may be defined on the plane, the first region may be a region in which three plates being the upper conductive plate, the middle conductive plate, and the lower conductive plate are projected, the second region may be a region in which only two plates being the middle conductive plate and one of the upper conductive plate and the lower conductive plate are projected, and the third region may be a region in which only another of the upper conductive plate and the lower conductive plate is projected.

In the aforementioned structure as well, the three conductive plates stacked on each other can be held in the same direction by a single jig in manufacturing the semiconductor device. The semiconductor device can be manufactured with high precision by using the single jig. In this case, the areas of the three conductive plates may be same as or different from each other. For example, the area of each of the conductive plates may suitably be determined by giving consideration to an expected temperature distribution within the semiconductor device.

Representative, non-limiting examples of the present disclosure will now be described in further detail with reference to the attached drawings. This detailed description is merely intended to tea a person of skill in the art further details for practicing aspects of the present teachings and is not intended to limit the scope of the present disclosure. Furthermore, each of the additional features and teachings disclosed below may be utilized separately or in conjunction with other features and teachings to provide improved semiconductor devices, as well as methods for using and manufacturing the same.

Moreover, combinations of features and steps disclosed in the following detailed description may not be necessary to practice the present disclosure in the broadest sense, and are instead taught merely to particularly describe representative examples of the present disclosure. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matte independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

EMBODIMENTS

A semiconductor device 10 of an embodiment will be described with reference to FIGS. 1 to 5. The semiconductor device 10 of the present embodiment is employed in a power controller of an electric vehicle, for example, and can constitute a part of a power converter circuit such as a converter and an inverter. The electric vehicle described herein refers broadly to vehicles having a motor configured to drive a wheel, and may for example include an electric vehicle charged by external power, a hybrid vehicle including an engine in addition to a motor, and a fuel cell vehicle using a fuel cell as its power source.

The semiconductor device 10 comprises a plurality of semiconductor chips 12, 14, a plurality of conductive plates 16, 18, 20, and an encapsulant 30. The encapsulant 30 encapsulates the plurality of semiconductor chips 12, 14 and integrally holds the plurality of conductive plates 16, 18, 20. The encapsulant 30 is constituted of an insulative material. Although not particularly limited, the encapsulant 30 in the present embodiment is constituted of a resin material for encapsulation, such as epoxy resin.

The encapsulant 30 has a substantially plate-like shape, and includes an upper surface 30a, a lower surface 30b, a first end surface 30c, a second end surface 30d, a first side surface 30e, and a second side surface 30f. The upper surface 30a and the lower surface 30b are located opposite from each other, and each of the first end surface 30c, the second end surface 30d, the first side surface 30e, and the second side surface 30f extends between the upper surface 30a and the lower surface 30b. Further, the first end surface 30c and the second end surface 30d are located opposite from each other, and the first side surface 30e and the second side surface 30f are located opposite from each other.

The plurality of semiconductor chips 12, 14 includes a first semiconductor chip 12 and a second semiconductor chip 14. The first semiconductor chip 12 and the second semiconductor chip 14 are power semiconductor chips, and have a same structure as each other. The semiconductor chip 12 is provided with a semiconductor substrate 12a, a first main electrode 12h, a second main electrode 12c, and a plurality of signal electrodes 12d. Similarly, the semiconductor chip 14 is provided with a semiconductor substrate 14a, a first main electrode 14b, a second main electrode 14c, and a plurality of signal electrodes 14d. Although not particularly limited, each of the semiconductor substrates 12a, 14a may be a silicon substrate, a silicon carbide substrate, or a nitride semiconductor substrate.

Each of the first main electrodes 12b, 14b is located on a front surface of the corresponding semiconductor substrate 12a, 14a, and each of the second main electrodes 12c, 14c is located on a rear surface of the corresponding semiconductor substrate 12a, 14a. The first main electrode 12b and the second main electrode 12c are electrically connected to each other through the semiconductor substrate 12a. Similarly, the first main electrode 14b and the second main electrode 14c are electrically connected to each other through the semiconductor substrate 14a. Although not particularly limited, each of the semiconductor chips 12, 14 is a switching element, and is configured to electrically connect and disconnect the corresponding first main electrode 12b, 14b and the corresponding second main electrode 12c, 14c selectively. Each plurality of signal electrodes 12d, 14d is located on a front surface of the corresponding semiconductor substrate 12a, 14a, similar to each of the first main electrodes 12b, 14b. Each of the signal electrodes 12d, 14d is sufficiently smaller than the corresponding first main electrode 12b, 14b and the corresponding second main electrode 12c, 14e. However, since both the first main electrode 12b and the plurality of signal electrodes 12d are located on the front surface of the semiconductor substrates 12a, an area of the first main electrode 12b is smaller than an area of the second main electrode 12c. Similarly, since both the first main electrode 14b and the plurality of signal electrodes 14d are located on the front surface of the semiconductor substrate 14a, an area of the first main electrode 14b is smaller than an area of the second main electrode 14c. Each of the first main electrodes 12b, 14b, the second main electrodes 12c, 14c, and the signal electrodes 12d, 14d may be constituted of one or more types of metal, such as aluminum, nickel, and gold.

Figure 4:
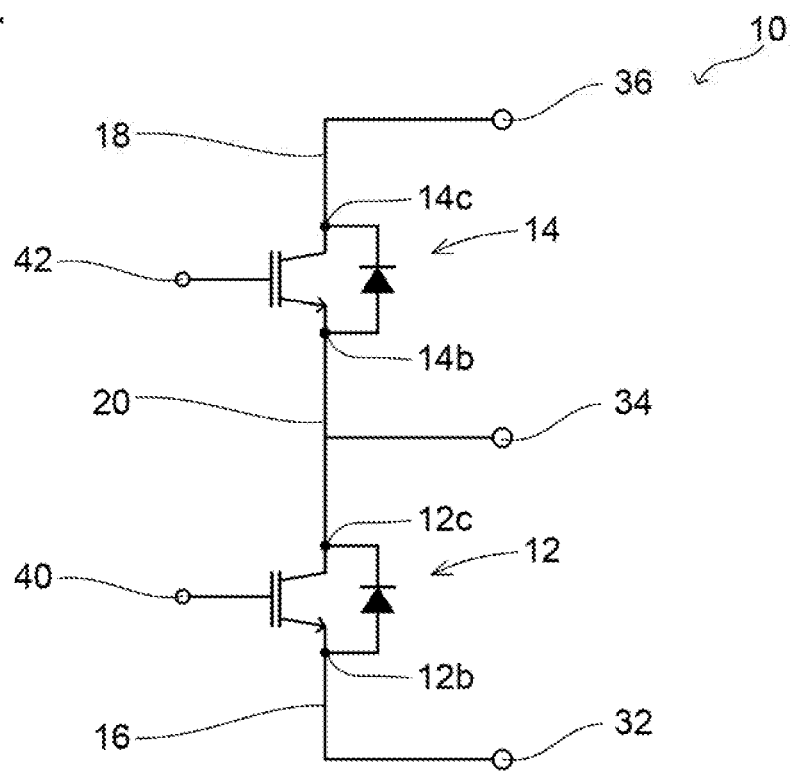
FIG. 4 shows a circuit structure of the semiconductor device 10 of the embodiment.

Although this is merely an example, as shown in FIG. 4, each of the semiconductor chips 12, 14 in the present embodiment is a Reverse Conducting-Insulated Gate Bipolar Transistor (RC-IGBT) in which an IGBT and a diode an integrally configured. Each of the first main electrodes 12b, 14b is connected to an emitter of the corresponding IGBT and an anode of the corresponding diode, and each of the second main electrodes 12c, 14c is connected to a collector of the corresponding IGBT and a cathode of the corresponding diode. Further, one electrode of each plurality of signal electrodes 12d, 14d is connected to a gate of the corresponding IGBT. As another embodiment, the first semiconductor chip 12 and/or the second semiconductor chip 14 may be Metal-Oxide-Semiconductor Field-Effect Transistors (MOSFETs). In this case, one or both of the first main electrodes 12b, 14b are connected to source(s) of the corresponding MOSFET(s) and one or both of the second main electrode 12c, 14c are connected to drain(s) of the corresponding MOSFET(s). Further, one electrode of one plurality or both pluralities of signal electrodes 12d, 4d is connected to a gate of the corresponding MOSFET.

The plurality of conductive plates 16, 18, 20 includes an upper conductive plate 16, a middle conductive plate 20, and a lower conductive plate 18. Each of the conductive plates 16, 18, 20 is a plate-like member having conductivity at least in part thereof. Three conductive plates 16, 18, 20 are stacked on each other, and the plurality of semiconductor chips 12, 14 are interposed therebetween. That is, the first semiconductor chip 12 is located between the upper conductive plate 16 and the middle conductive plate 20 and is electrically connected to both the upper conductive plate 16 and the middle conductive plate 20. The second semiconductor chip 14 is located between the middle conductive plate 20 and the lower conductive plate 18 and is electrically connected to both the middle conductive plate 20 and the lower conductive plate 18. Two or more first semiconductor chips 12 may be disposed between the upper conductive plate 16 and the middle conductive plate 20. In this case, the two or more first semiconductor chips 12 may be semiconductor chips of a same type (that is, having a same structure) or may be semiconductor chips of different types (that is, having different structures) from each other. Similarly, two or more same type or different types of second semiconductor chips 14 may be disposed between the middle conductive plate 20 and the lower conductive plate 18.

The upper conductive plate 16, the middle conductive plate 20, and the lower conductive plate 18 are each a plate-like member having conductivity, and at least a part thereof is constituted of a conductor Although this is merely an example, each of the conductive plates 16, 18, 20 in the present embodiment is a metal plate and is constituted of copper. The upper conductive plate 16 is electrically connected to the first main electrode 12b of the first semiconductor chip 12 via a first conductive spacer 13. The middle conductive plate 20 is electrically connected to the second main electrode 12c of the first semiconductor chip 12. Although not particularly limited, the upper conductive plate 16 and the first conductive spacer 13, the first conductive spacer 13 and the first main electrode 12b of the first semiconductor chip 12, and the second main electrode 12c of the first semiconductor chip 12 and the middle conductive plate 20 may respectively be joined to each other by joint layers 50, 52, 54 (such as solder layers) having conductivity.

The middle conductive plate 20 is further electrically connected also to the first main electrode 14b of the second semiconductor chip 14 via a second conductive spacer 15. Further, the lower conductive plate 18 is electrically connected to the second main electrode 14c of the second semiconductor chip 14. Although not particularly limited, the middle conductive plate 20 and the second conductive spacer 15, the second conductive spacer 15 and the first main electrode 14b of the second semiconductor chip 14, and the second main electrode 14c of the second semiconductor chip 14 and the lower conductive plate 18 may respectively be joined to each other by joint layers 60, 62, 64 (such as solder layers) having conductivity.

The upper conductive plate 16 is exposed outside on the upper surface 30a of the encapsulant 30. Due to this, the upper conductive plate 16 not only constitutes a part of an electrical circuit of the semiconductor device 10, but also functions as a heat dissipating plate for dissipating heat from the semiconductor chips 12, 14 to outside. Similarly, the lower conductive plate 18 is exposed outside on the lower surface 30b of the encapsulant 30. As such, also the lower conductive plate 18 not only constitutes a part of the electrical circuit of the semiconductor device 10, but also functions as a heat dissipating plate for dissipating heat from the semiconductor chips 12, 14 to outside.

The semiconductor device 10 includes a plurality of power terminals 32, 34, 36 and pluralities of signal terminals 40, 42. Although not particularly limited, these terminals 32, 34, 36, 40, 42 are constituted of metal such as copper. The plurality of power terminals 32, 34, 36 protrudes from the second end surface 30d of the encapsulant 30. The pluralities of signal terminals 40, 42 protrude from the first end surface 30c of the encapsulant 30. However, specific structures such as positions and shapes of these terminals 32, 34, 36, 40, 42 are not particularly limited.

The plurality of power terminals 32, 34, 36 includes a first power terminal 32, a second power terminal 34, and a third power terminal 36. The first power terminal 32 is electrically connected to the upper conductive plate 16 within the encapsulant 30. Due to this, the first main electrode 12b of the first semiconductor chip 12 is electrically connected to the first power terminal 32 via the upper conductive plate 16. Although not particularly limited, the first power terminals 32 may be integrally configured with the upper conductive plate 16.

The second power terminal 34 is electrically connected to the middle conductive plate within the encapsulant 30. Due to this, the second main electrode 12c of the first semiconductor chip 12 and the first main electrode 14b of the second semiconductor chip 14 are electrically connected to the second power terminal 34 via the middle conductive plate 20. Although not particularly limited, the second power terminal 34 may be integrally configured with the middle conductive plate 20. The third power terminal 36 is electrically connected to the lower conductive plate 18 within the encapsulant 30. Due to this, the second main electrode 14c of the second semiconductor chip 14 is electrically connected to the third power terminal 36 via the lower conductive plate 18. Although not particularly limited, the third power terminal 36 may be integrally configured with the lower conductive plate 18.

The pluralities of signal terminals 40, 42 include a plurality of first signal terminals 40 and a plurality of second signal terminals 42. The plurality of first signal terminals 40 is electrically connected to the plurality of signal electrodes 12d of the first semiconductor chip 12 respectively within the encapsulant 30. Although not particularly limited, the first signal terminals 40 and the signal electrodes 12d are joined in pairs to each other via joint layers 56 (such as a solder layer). Similarly, the plurality of second signal terminals 42 is electrically connected to the plurality of signal electrodes 14d of the second semiconductor chip 14 respectively within the encapsulant 30. Although not particularly limited, the second signal terminals 42 and the signal electrodes 14d are joined in pairs to each other via joint layers 66 (such as a solder layer).

When the semiconductor device 10 of the present embodiment is to be manufactured, the three conductive plates 16, 20, 18 need to be joined via the semiconductor chips 12, 14. In doing so, in order to manufacture the semiconductor device 10 with high precision, the three conductive plates 16, 20, 18 need to be positioned correctly. However, due to a need of removal afterward, it is difficult to hold the three conductive plates 16, 20, 18 stacked on each other by a single jig. As such, consideration may be given to using a jig configured to separate into two or more, however, use of such plural jig parts may bring forth deterioration in dimensional precision as compared to using a single jig.

Figure 5:
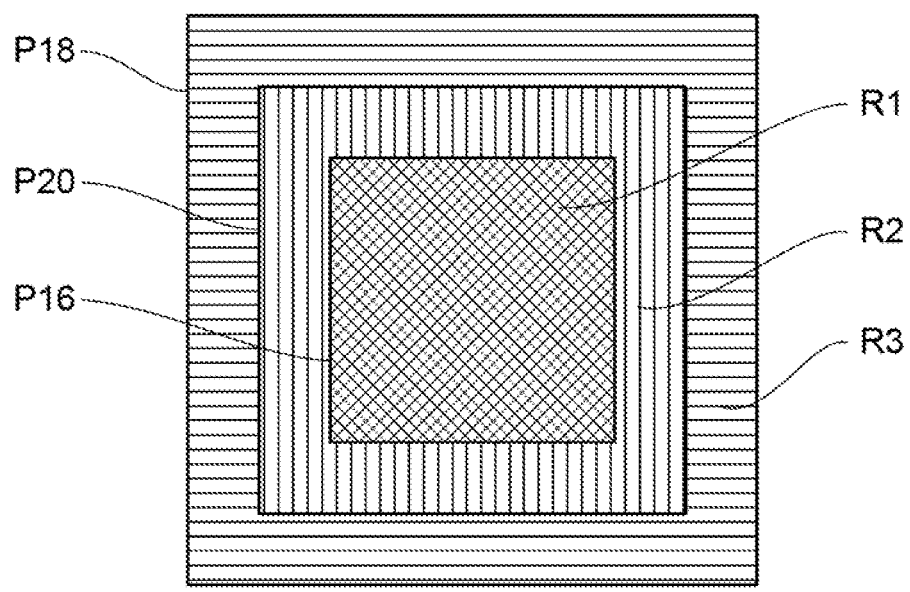
FIG. 5 shows projected regions P16, P20, P18 obtained by projecting three conductive plates 16, 20, 18 onto a plane parallel thereto. In the drawing, the projected region P16 indicates a projected region of the upper conductive plate 16, the projected region P20 indicates a projected region of the middle conductive plate 20, and the projected region P18 indicates a projected region of the lower conductive plate 18.

In regard to this problem, the semiconductor device 10 of the present embodiment has the area of the upper conductive plate 16 that is smaller than the area of the middle conductive plate 20, and the area of the lower conductive plate 18 that is larger than the area of the middle conductive plate 20. That is, the areas of the three conductive plates 16, 20, 18 are configured to become gradually larger (or smaller) along their stacking direction. As such, as shown in FIG. 5, when the three conductive plates 16, 20, 18 are projected to a plane parallel thereto, a first region R1, a second region R2, and a third region R3 are defined in this plane. The first region R1 is a region in which the three plates, namely the upper conductive plate 16, the middle conductive plate 20, and the lower conductive plate 18, are projected. The second region R2 is a region in which only two plates, namely the lower conductive plate 18 and the middle conductive plate 20, are projected. Further, the third region R3 is a region in which only the lower conductive plate 18 is projected.

Figure 6:
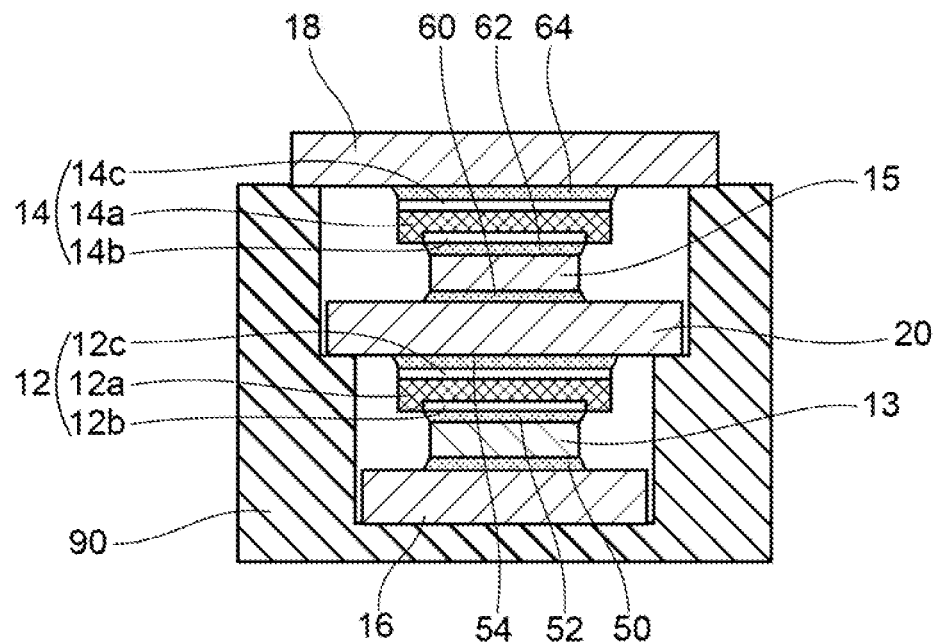
FIG. 6 shows a state in which the three conductive plates 16, 20, 18 stacked on each other via semiconductor chips 12, 14 are held by a single jig 90.
Figure 7:
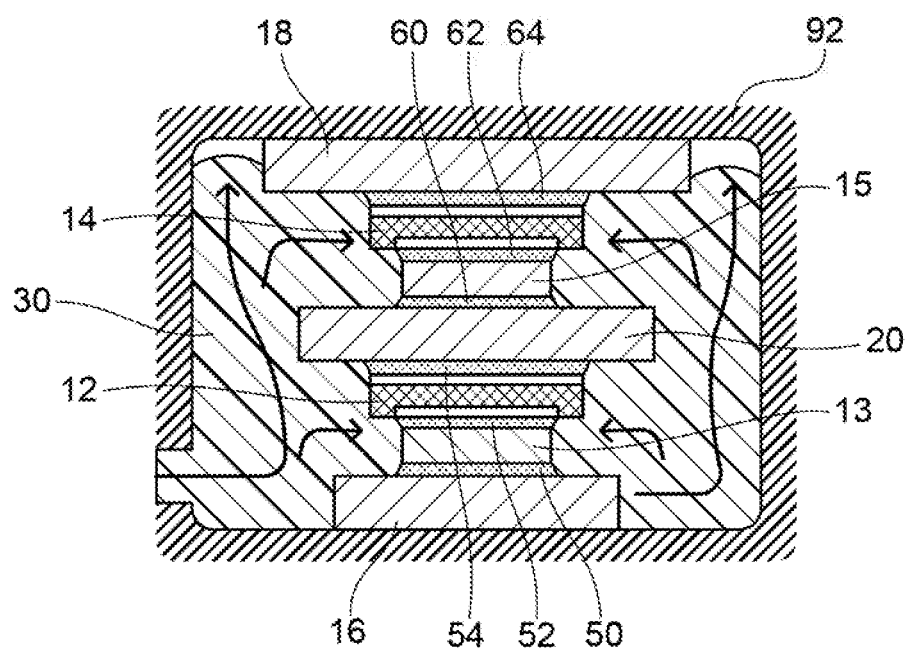
FIG. 7 shows a state in which an encapsulant 30 is formed by using a mold 92.

According to the aforementioned structure, the three conductive plates 16, 20, 18 stacked on each other can be held in a same direction by a single jig 90 as shown in FIG. 6. The semiconductor device 10 can be manufactured with high precision by using the single jig 90. In addition, as shown in FIG. 7, when the semiconductor device 10 is to be manufactured, formation of the encapsulant 30 is performed using a mold 92 (insert molding). In doing so, when the areas of the three conductive plates 16, 20, 18 are configured to become gradually larger (or smaller) along their stacking direction, a material of the encapsulant 30 (such as resin) can smoothly flow within the mold 92, and generation of defects such as voids can be suppressed.

In the semiconductor device 10 of the present embodiment, each of the semiconductor chips 12, 14 is provided with the corresponding first main electrode 12b, 14b and the corresponding second main electrode 12c, 14c, and the area of the second main electrode 12c, 14c is larger than the area of the first main electrode 12b, 14b. When the area of the second main electrode 12c, 14c is larger than the area of the first main electrode 12h, 14b in each of the semiconductor chips 12, 14, heat is dissipated at a larger quantity through the second main electrode 12c, 14c than through the first main electrode 12b, 14b. As such, a consideration may be given to improving a heat dissipating performance of the conductive plates 20, 18 connected to the second main electrodes 12c, 14c by increasing the areas of the conductive plates 20, 18 connected to the second main electrodes 12c, 14c than the areas of the conductive plates 16, 20 connected to the first main electrodes 12b, 14b. Based on such a concept, the semiconductor device 10 of the present embodiment has the area of the upper conductive plate 16 smaller than the area of the middle conductive plate 20, and the area of the lower conductive plate 18 larger than the area of the middle conductive plate 20.

Figure 8:
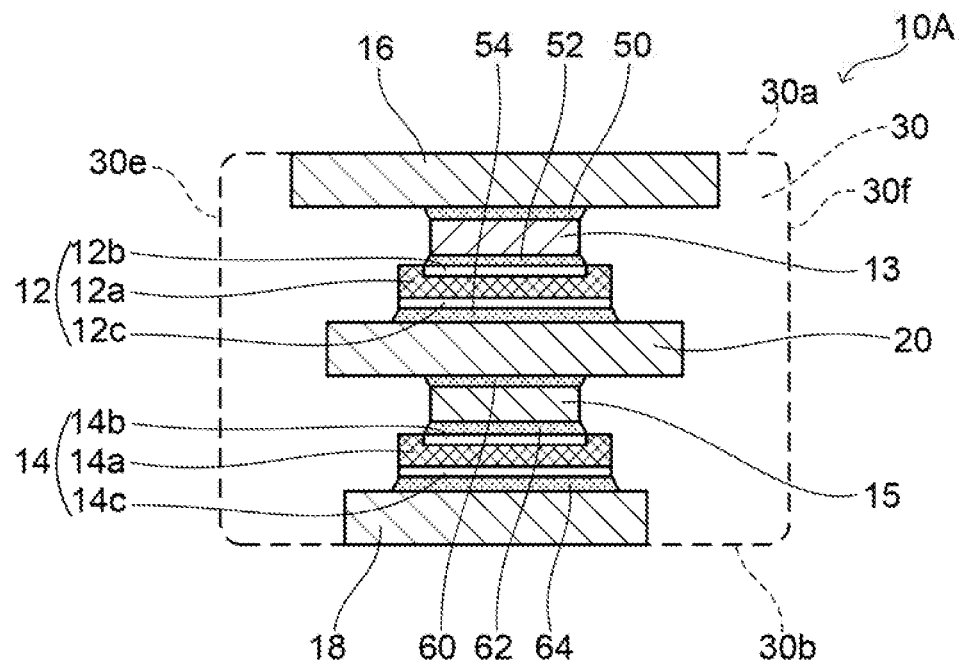
FIG. 8 is a cross-sectional view schematically showing a configuration of a semiconductor device 10A of a variant, and corresponds to the cross-sectional view shown in FIG. 2.

FIG. 8 shows a semiconductor device 10A of a variant. As shown in FIG. 8, this semiconductor device 10A has an area of a lower conductive plate 18 smaller than an area of a middle conductive plate 20, and an area of an upper conductive plate 16 larger than the area of the middle conductive plate 20. In this variant as well, the areas of the three conductive plates 16, 20, 18 are configured to become gradually larger (or smaller) along their stacking direction. As such, in manufacturing this semiconductor device 10A as well, the three conductive plates 16, 20, 18 stacked on each other can easily be held from a same direction by a single jig 90, and the semiconductor device 10A can be manufactured with high precision.

In each of semiconductor chips 12, 14, an area of a second main electrode 12c, 14c is larger than an area of a first main electrode 12b, 14b, so a heat dissipating performance of the first main electrode 12b, 14b is inferior to a heat dissipating performance of the second main electrode 12c, 14c. As such, a temperature in each of the first main electrodes 12b, 14b may become higher than a temperature in each of the second main electrodes 12c, 14c when the respective semiconductor chips 12, 14 generate heat by electrical conduction. To suppress such temperature differences, consideration may be given to increasing the areas of the conductive plates 16, 20 connected to the first main electrodes 12b, 14b larger than the areas of the conductive plates 20, 18 connected to the second main electrodes 12c, 14c to increase the heat dissipating performance of the conductive plates 16, 20 connected to the first main electrodes 12b, 14b. Based on such a concept, in the semiconductor device 10A of the present variant, the area of the upper conductive plate 16 is larger than the are of the middle conductive plate 20 and the area of the lower conductive plate 18 is smaller than the are of the middle conductive plate 20.

In the semiconductor device 10A of the variant shown in FIG. 8, each of the first semiconductor chip 12 and the second semiconductor chip 14 may further include a protection film (not shown) provided in a frame-like shape along an edge of its first main electrode 12b, 14b. According to such a configuration, distortion caused by thermal deformation is known to increase locally in a vicinity of each protection film due to different types of materials having different linear expansion coefficients being gathered at such a location. It is effective to suppress a temperature rise in each of the first main electrodes 12b, 14b to suppress an increase of such distortion, and in order to do so, consideration may be given to increasing the heat dissipating performance of the conductive plates 16, 20 connected to the first main electrodes 12b, 14b. In regard to this point, the temperature rise in each of the first main electrodes 12b, 14b can effectively be suppressed when the area of the upper conductive plate 16 is larger than the area of the middle conductive plate 20 and the area of the lower conductive plate 18 is smaller than the area of the middle conductive plate 20.

Figure 9:
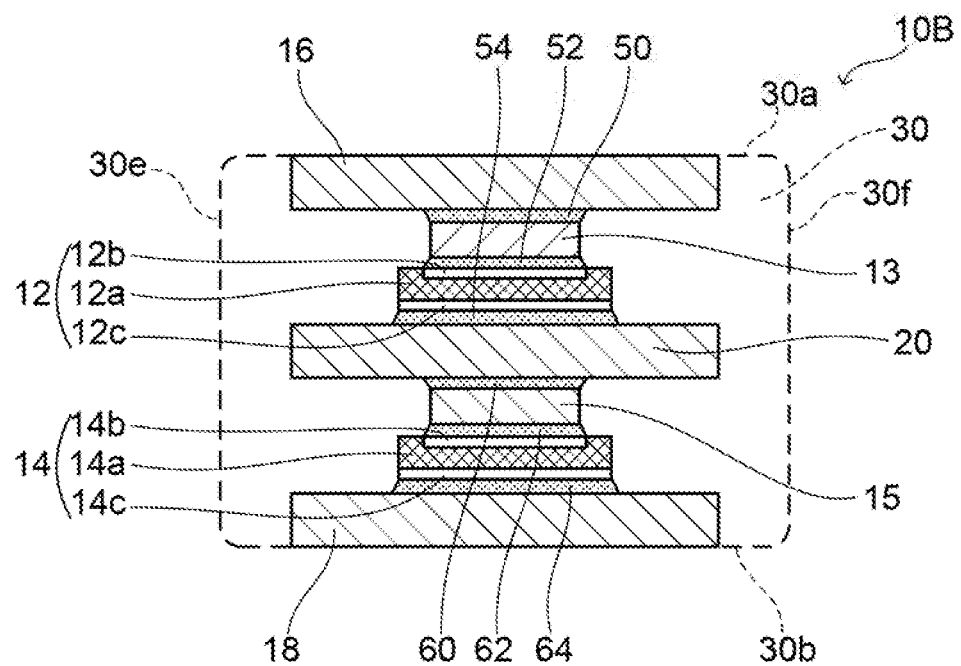
FIG. 9 is a cross-sectional view schematically showing a configuration of a semiconductor device 10B of a variant, and corresponds to the cross-sectional view shown in FIG. 2.
Figure 10A:
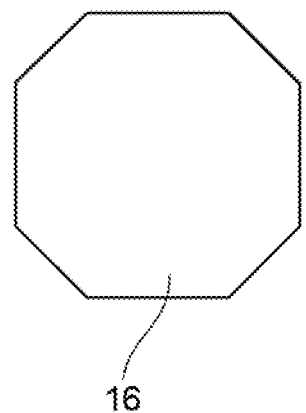
FIGS. 10a to 10c show shapes of the three conductive plates 16, 18, 20 employed in the semiconductor device 10B shown in FIG. 9.
Figure 10B:
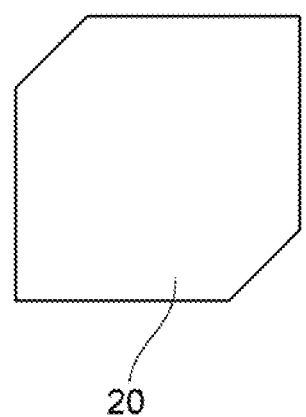
Figure 10C:
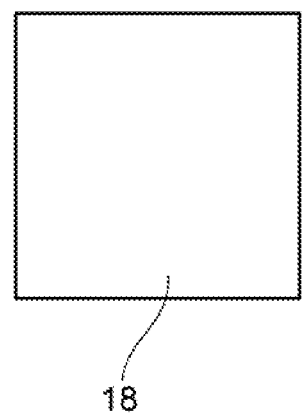

FIGS. 9 and 10a to 10c show a semiconductor device 10B of another variant. As shown in FIG. 9, areas of three conductive plates 16, 20, 18 are substantially equal to each other in this semiconductor device 10B. However, as shown in FIGS. 10a to 10c, the three conductive plates 16, 20, 18 have shapes that differ from each other. That is, the upper conductive plate 16 has a substantially square shape, but four corners thereof are chamfered. The middle conductive plate 20 also has a substantially square shape, but has only two corners located diagonal to each other chamfered. Further, the lower conductive plate 18 has a substantially square shape, but corners thereof are not chamfered.

Figure 11:
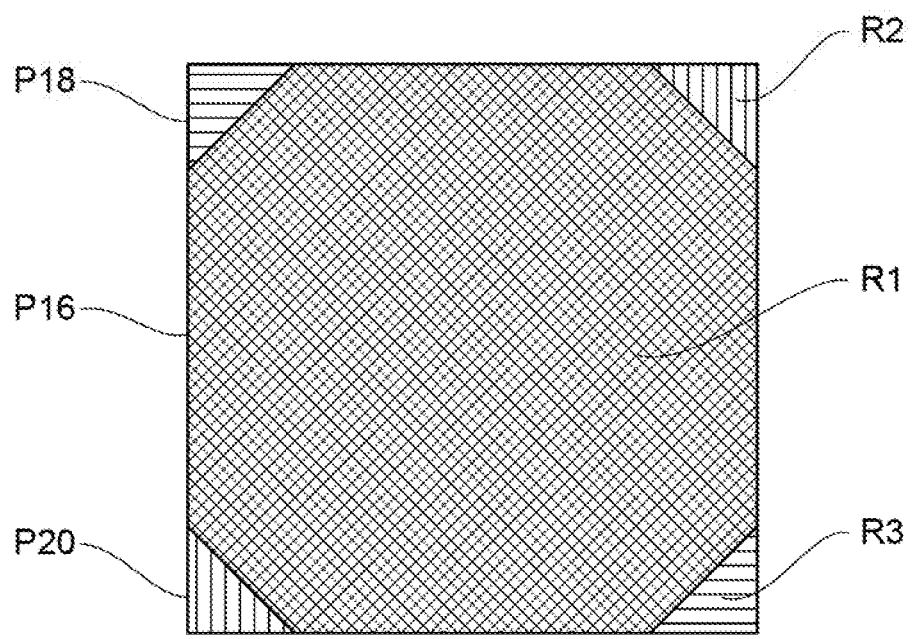
FIG. 11 shows projected regions P16. P20, P18 obtained by projecting three conductive 25 plates 16, 20, 18 onto a plane parallel thereto in regard to the semiconductor device 10B shown in FIG. 9. In the drawing, the projected region P16 indicates a projected region of the upper conductive plate 16, the projected region P20 indicates a projected region of the middle conductive plate 20, and the projected region P18 indicates a projected region of the lower conductive plate 18.
Figure 12:
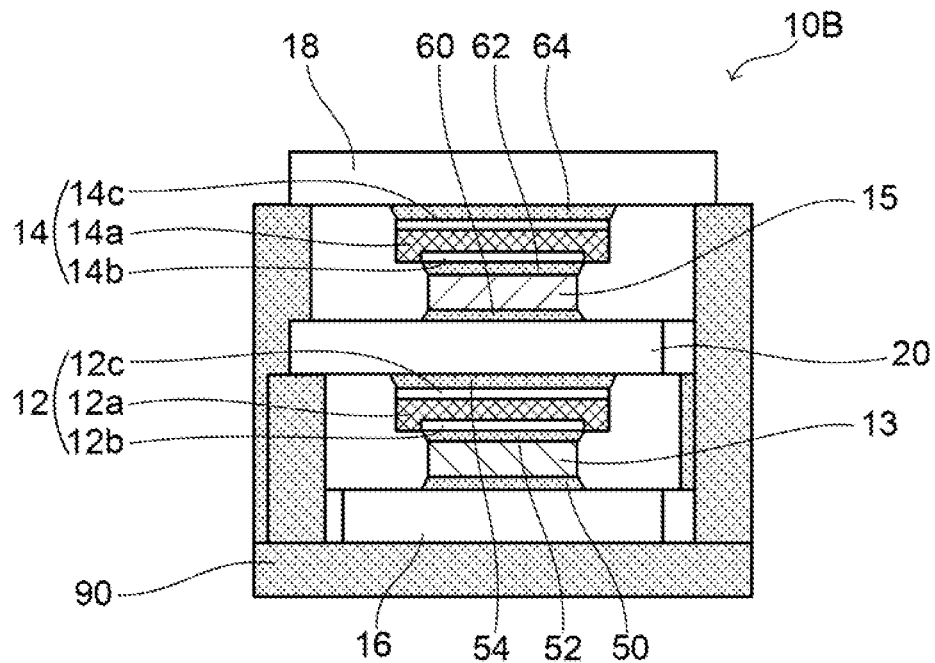
FIG. 12 shows a state in which the three conductive plates 16, 20, 18 stacked on each other via semiconductor chips 12, 14 are held by a single jig 90 in regard to the semiconductor device 10B shown in FIG. 9.

In the aforementioned structure as well, when the three conductive plates 16, 20, 18 are projected to a plane parallel thereto as shown in FIG. 11, a first region R1, a second region R2, and a third region R3 are defined in the plane. The first region R1 is a region in which the three plates, namely the upper conductive plate 16, the middle conductive plate 20, and the lower conductive plate 18, are projected. The second region R2 is a region in which only two plates, namely the lower conductive plate 18 and the middle conductive plate 20, are projected. Further, the third region R3 is a region in which only the lower conductive plate 18 is projected. As such, according to the structure of this variant as well, the three conductive plates 16, 20, 18 stacked on each other can be held in a same direction by a single jig 90 as shown in FIG. 12. By using the single jig 90, the semiconductor device 10B can be manufactured with high precision.

In order to stably hold the lower conductive plate 18 by the single jig 90, it is preferable that a triangle surrounding a gravity center position of the lower conductive plate 18 with three points located within the third region R3 as apexes can be depicted. Similarly, in order to stably hold the middle conductive plate 20 by the single jig 90, it is preferable that a triangle surrounding a gravity center position of the middle conductive plate 20 with three points located within the second region R2 as apexes can be depicted. However, the jig 90 may include a suction mechanism or a clamp mechanism, for example, in which cases the aforementioned limitation is not necessarily required.

Figure 13:
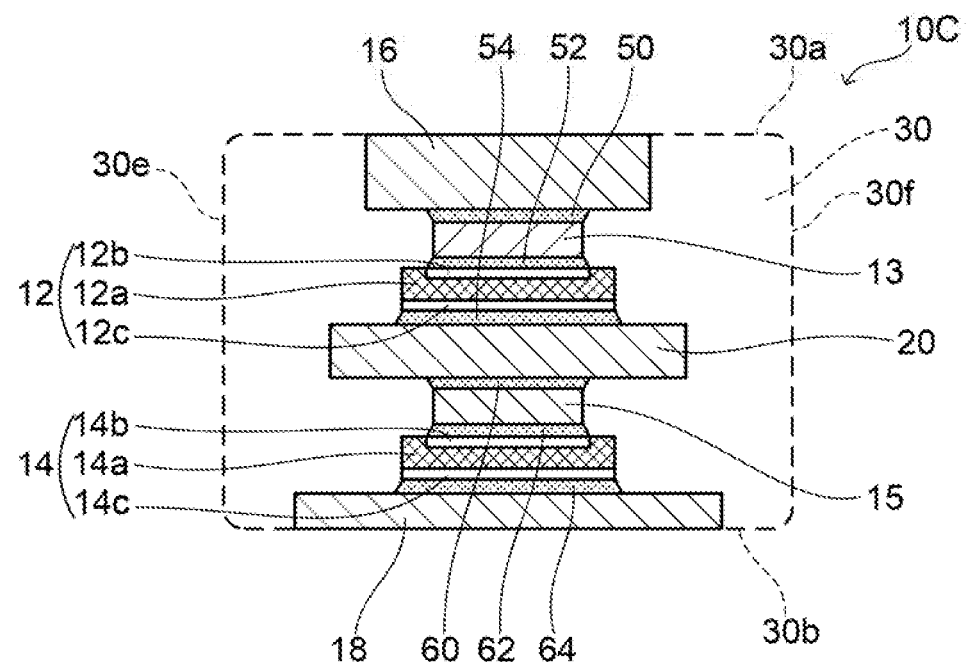
FIG. 13 is a cross-sectional view schematically showing a configuration of a semiconductor device 10C of a variant, and corresponds to the cross-sectional view shown in FIG. 2.
Figure 14:
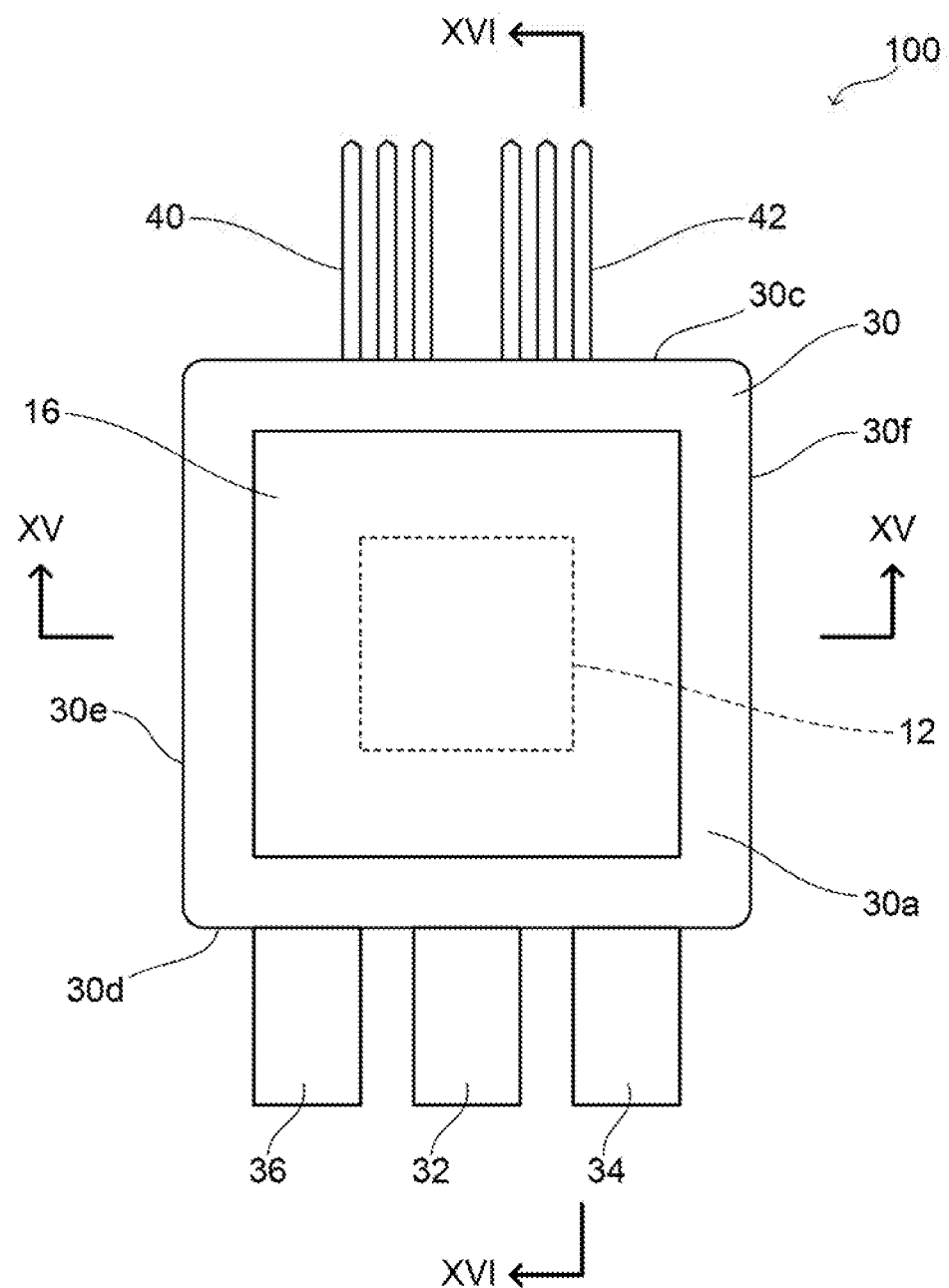
FIG. 14 shows an outer appearance of a semiconductor device 100 of a reference example 1 of a related technology.

FIG. 13 shows a semiconductor device 10C of another variant. As shown in FIG. 13, in this semiconductor device 10C, a thickness of an upper conductive plate 16 having a smaller area is larger than a thickness of a lower conductive plate 18 having a larger area. When the upper conductive plate 16 and the lower conductive plate 18 are in a relationship in which the thickness of the conductive plate with the smaller area is larger than the thickness of the conductive plate with the larger area, a difference in thermal capacity between the upper conductive plate 16 and the lower conductive plate 18 becomes smaller. Due to this, a difference in a heat dissipating performance between the two conductive plates 16, 18 becomes smaller accordingly, and a temperature difference that may occur between the first semiconductor chip 12 and the second semiconductor chip 14 can be reduced, for example.

Reference Example 1 of Related Technology

A reference example 1 of a related technology will be described with reference to FIGS. 14 to 21. Constituent features in common or corresponding to those of the semiconductor device 10 of the aforementioned embodiment will be given the same reference signs and overlapping descriptions thereof will suitably be omitted. As shown in FIGS. 14 to 17, a semiconductor device 100 of the reference example 1 is also provided with an upper conductive plate 16, a middle conductive plate 20, and a lower conductive plate 18 stacked on each other, a first semiconductor chip 12 located between the upper conductive plate 16 and the middle conductive plate 20 and electrically connected to both the upper conductive plate 16 and the middle conductive plate 20, a second semiconductor chip 14 located between the middle conductive plate 20 and the lower conductive plate 18 and electrically connected to both the middle conductive plate 20 and the lower conductive plate 18, and an encapsulant 30 encapsulating the first semiconductor chip 12 and the second semiconductor chip 14 and integrally holding the upper conductive plate 16, the middle conductive plate 20, and the lower conductive plate 18.

Similar to the semiconductor device 10 of the aforementioned embodiment, the semiconductor device 100 of the reference example 1 is also employed in a power converter circuit such as a converter and an inverter, and can constitute a switching circuit configured to electrically flow and cut off current. When the current flows in the first semiconductor chip 12 and the second semiconductor chip 14, each of the first semiconductor chip 12 and the second semiconductor chip 14 generates heat. When the first semiconductor chip 12 and the second semiconductor chip 14 generate heat, temperatures of the three conductive plates 16, 18, 20 adjacent thereto also rise, and thermal expansion occurs in each of the conductive plates 16, 18, 20. Especially, the middle conductive plate 20 located between the first semiconductor chip 12 and the second semiconductor chip 14 tends to become hotter than the upper conductive plate 16 and the lower conductive plate 18. In this case, relatively large thermal expansion occurs in the middle conductive plate 20 than in the upper conductive plate 16 and in the lower conductive plate 18, as a result of which distortion generated within the semiconductor device 100 could locally be aggravated.

Figure 15:
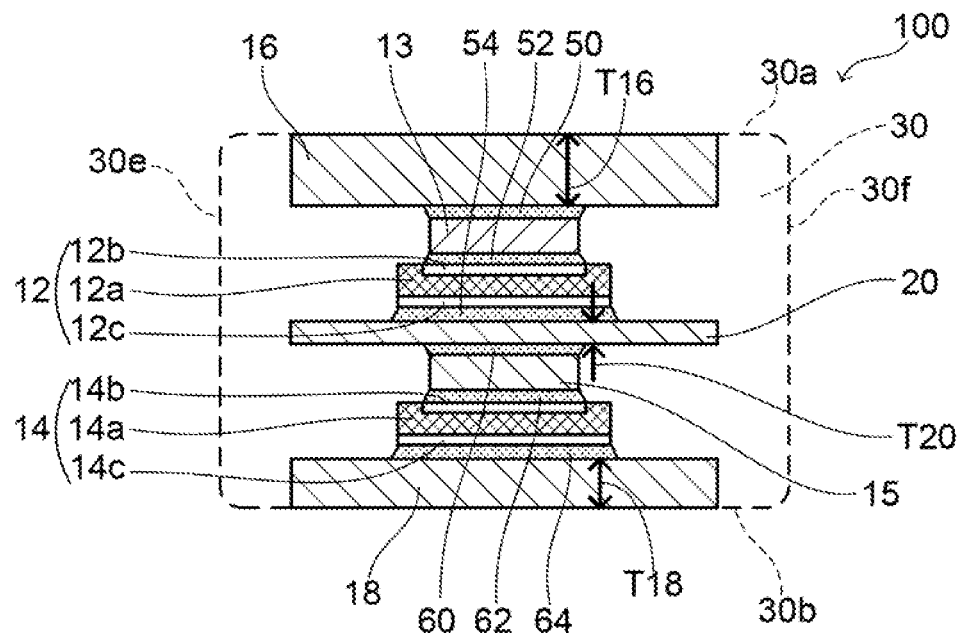
FIG. 15 shows a cross-sectional view along a line XV-XV of FIG. 14.
Figure 16:
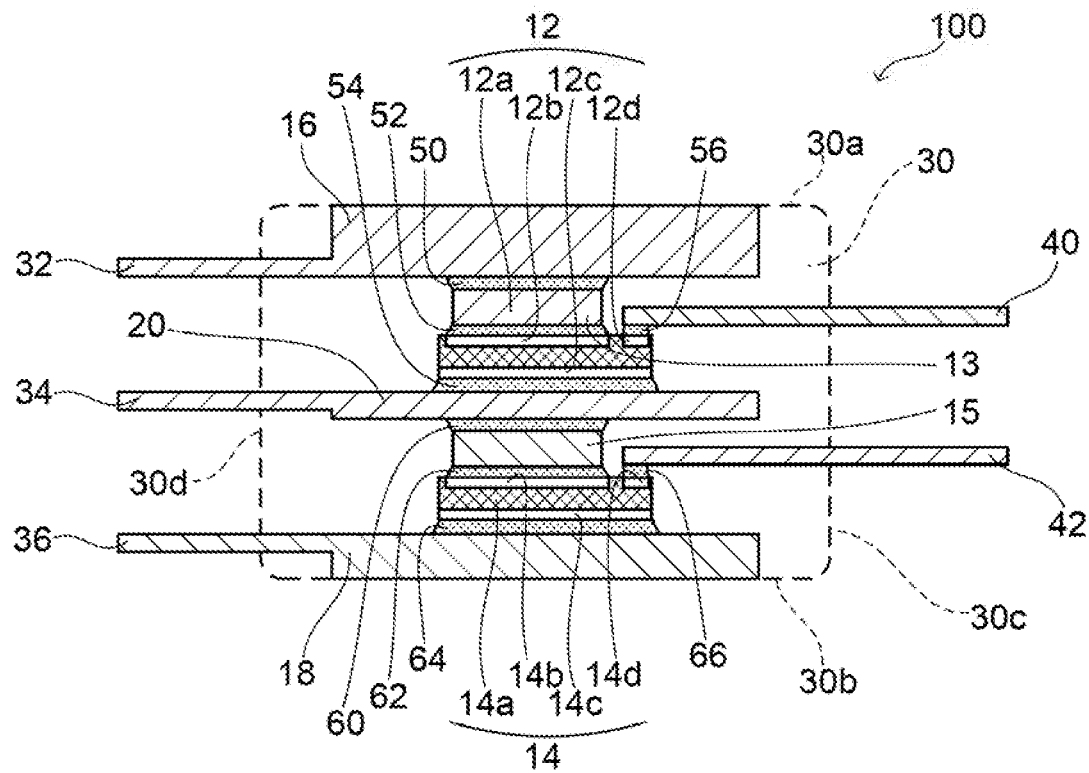
FIG. 16 shows a cross-sectional view along a line XVI-XVI of FIG. 14.
Figure 17:
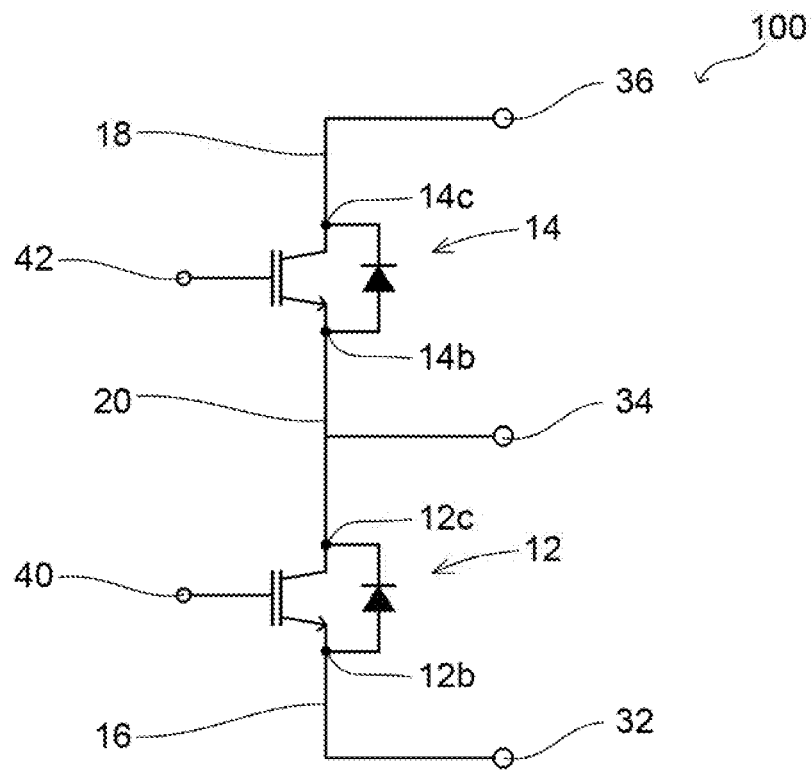
FIG. 17 shows a circuit structure of the semiconductor device 100 of the reference example 1.

Due to this, in the semiconductor device 100 of the reference example 1, a thickness T20 of the middle conductive plate 20 is configured smaller than a thickness T16 of the upper conductive plate 16 and a thickness T18 of the lower conductive plate 18 (see FIG. 15). Due to the thickness T20 of the middle conductive plate 20 being relatively small, a force of the thermal expansion that may occur within the middle conductive plate 20 becomes relatively small. As aforementioned, the force of the thermal expansion in the middle conductive plate 20 means a force that acts from the middle conductive plate 20 to other members (such as joint layers 54, 60 adjacent thereto) when the middle conductive plate 20 thermally expands. Due to the force of the thermal expansion generated in the middle conductive plate 20 being small, the thermal expansion in the middle conductive plate 20 can effectively be suppressed by other members (such as the encapsulant 30) adjacent thereto. Due to this, the local distortion generated within the semiconductor device 100 (especially in the joint layers 54, 60) can be reduced.

In addition, a distance from the first semiconductor chip 12 to the lower conductive plate 18 becomes shorter when the thickness T20 of the middle conductive plate 20 is smaller. Due to this, a thermal resistance from the first semiconductor chip 12 to the lower conductive plate 18 becomes smaller, and the heat from the first semiconductor chip 12 is effectively dissipated from the lower conductive plate 18 as well. Similarly, a distance from the second semiconductor chip 14 to the upper conductive plate 16 becomes shorter when the thickness T20 of the middle conductive plate 20 is smaller. Due to this, a thermal resistance from the second semiconductor chip 14 to the upper conductive plate 16 becomes smaller, and the heat from the 15 second semiconductor chip 14 is effectively dissipated from the upper conductive plate 16 as well. As such, a temperature rise in both the first semiconductor chip 12 and the second semiconductor chip 14 is suppressed when the thickness T20 of the middle conductive plate 20 is smaller.

Although not particularly limited, in the semiconductor device 100 of the reference example 1, the thickness T16 of the upper conductive plate 16 is larger than the thickness T18 of the lower conductive plate 18. In regard to this point in each of the semiconductor chips 12, 14, an area of a second main electrode 12c, 14c is larger than an area of a first main electrode 12b, 14b. As such, in each of the semiconductor chips 12, 14, the heat is dissipated at a larger quantity through the second main electrode 12c, 14c than through the first main electrode 12b, 14b. In other words, a heat dissipating performance of the first main electrode 12b, 14b is inferior to a heat dissipating performance of the second main electrode 12c, 14c. In order to improve such uneven heat dissipating performances, it is effective to increase the thickness T16 of the upper conductive plate 16 connected to the first main electrode 12b larger than the thickness T18 of the lower conductive plate 18 connected to the second main electrode 12c. By configuring as such, the heat dissipation from the first main electrode 12b is enhanced by a relatively large thermal capacity of the upper conductive plate 16, and the heat dissipating performance of the first main electrode 12b is thereby improved.

Figure 18:
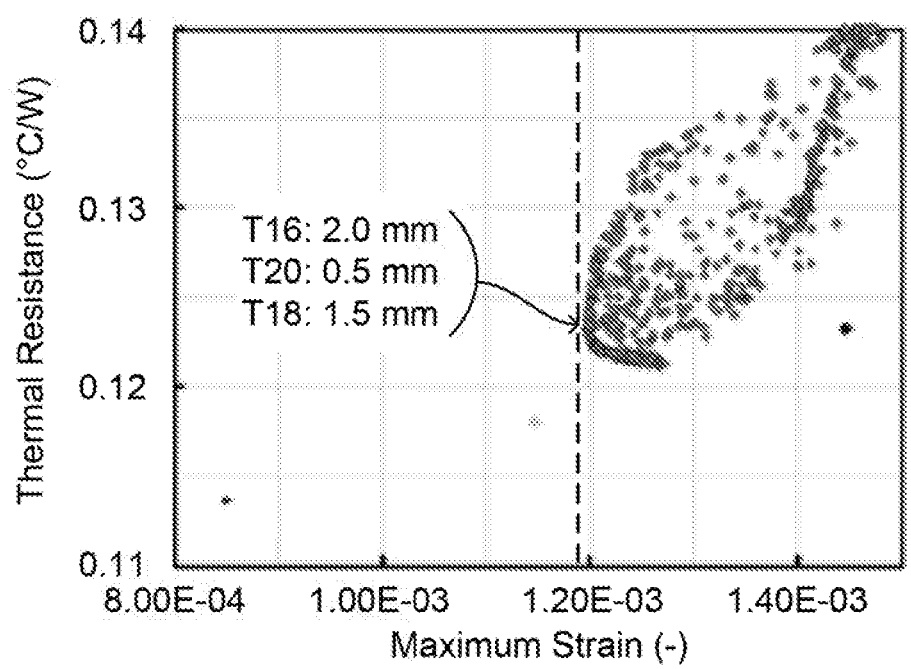
FIG. 18 shows a result calculated in computer simulation of characteristics of the semiconductor device 100 of the reference example 1.

FIG. 18 is a result of a computer simulation carried out by the inventors to confirm the above discovery. In this computer simulation, a thermal resistance (° C./W) and maximum distortion of the semiconductor device 100 were calculated for each sample in which the respective thicknesses T16, T20, T18 of the three conductive plates 16, 20, 18 are varied within a range of 0.5 mm to 2.0 mm, respectively (that is, for each of combinations of T16, T20, T18). As a result, as shown in FIG. 18, it was confirmed that the maximum distortion generated in the semiconductor device 100 became smallest when the thickness T20 of the middle conductive plate 20 was 0.5 mm, the thickness T16 of the upper conductive plate 16 was 2.0 mm, and the thickness T18 of the lower conductive plate 18 was 1.5 mm. Further, it was also confirmed that the maximum distortion generated in the semiconductor device 100 was sufficiently reduced when the thickness T20 of the middle conductive plate 20 was in a range of 0.5±0.1 mm, the thickness T16 of the upper conductive plate 16 was 2.0 mm, and the thickness T18 of the lower conductive plate 18 was in a range of 1.5±0.1 mm.

Figure 19:
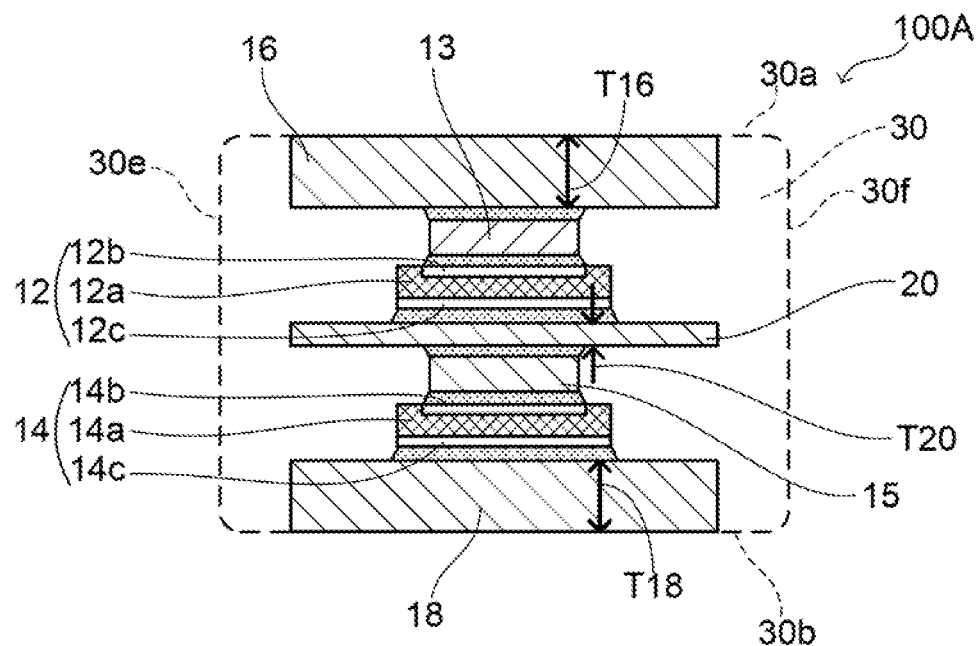
FIG. 19 shows a cross-sectional view schematically showing a configuration of a semiconductor device 100A of a variant of the reference example 1.

FIG. 19 shows a semiconductor device 100A of a variant. As shown in FIG. 19, a thickness T16 of an upper conductive plate 16 and a thickness T18 of a lower conductive plate 18 may be equal to each other. In this variant as well, thermal expansion of a middle conductive plate 20 is suppressed due to a thickness T20 of the middle conductive plate 20 being smaller than the thickness T16 of the upper conductive plate 16 and the thickness T18 of the lower conductive plate 18, and local distortion in the semiconductor device 100A is reduced.

Figure 20:
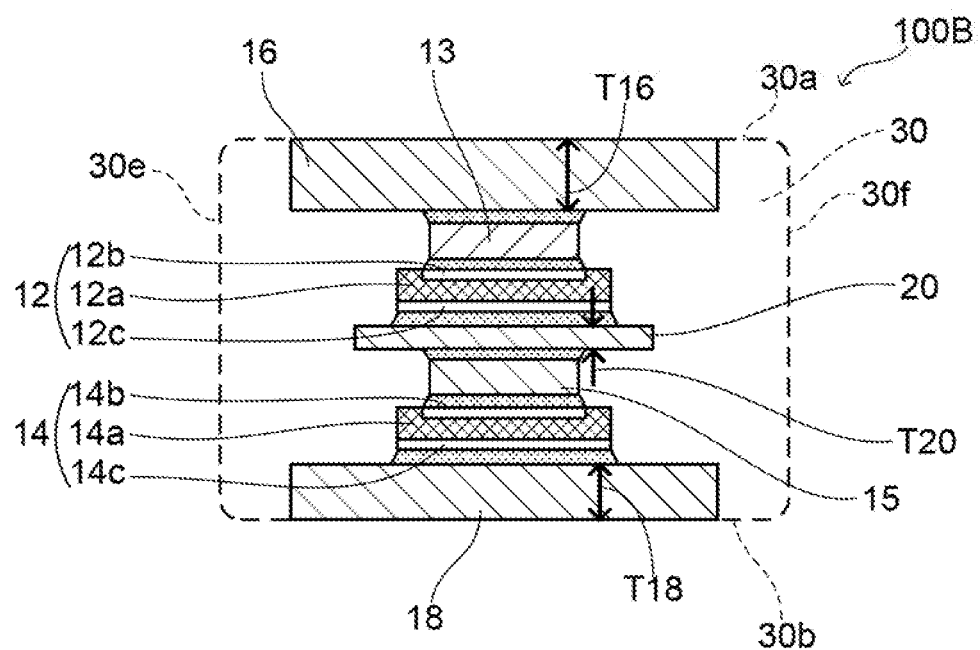
FIG. 20 shows a cross-sectional view schematically showing a configuration of a semiconductor device 100B of another variant of the reference example 1.

FIG. 20 shows a semiconductor device 100B of a variant. As shown in FIG. 20, an area of a middle conductive plate 20 may be smaller than an area of an upper conductive plate 16 and an area of a lower conductive plate 18. Heat from a first semiconductor chip 12 and a second semiconductor chip 14 is dissipated outside through the upper conductive plate 16 and the lower conductive plate 18. Contrary to this, the middle conductive plate 20 located between the first semiconductor chip 12 and the second semiconductor chip 14 is located within an encapsulant 30, and the heat from the first semiconductor chip 12 and the second semiconductor chip 14 tends to accumulate at such a location. Due to this, a temperature rise in the first semiconductor chip 12 and the second semiconductor chip 14 can effectively be reduced by configuring the area of the upper conductive plate 16 and the area of the lower conductive plate IS large and the area of the middle conductive plate 20 small.

Figure 21:
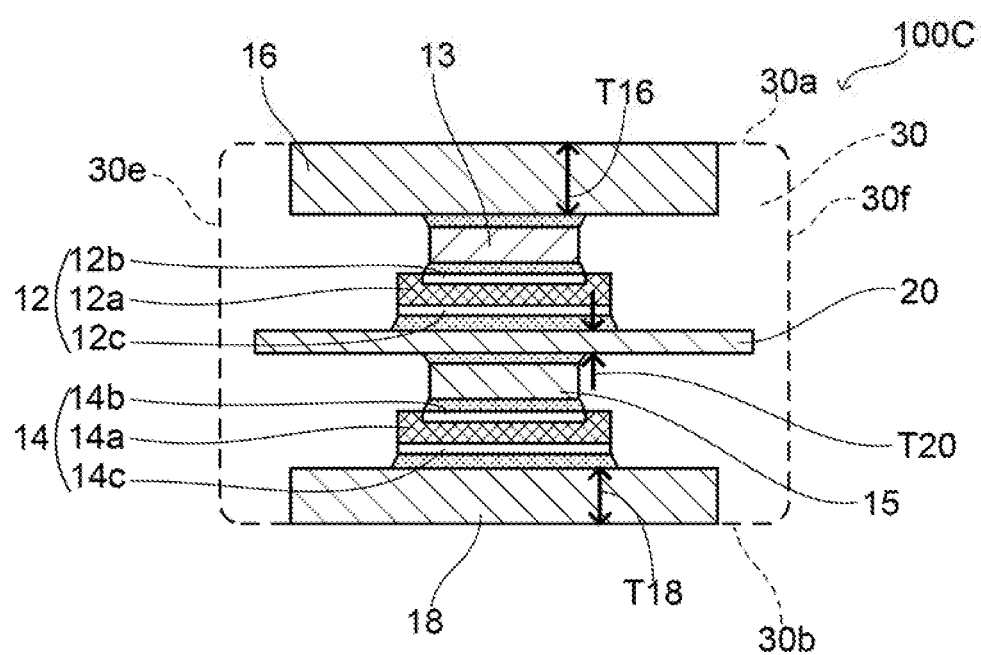
FIG. 21 shows a cross-sectional view schematically showing a configuration of a semiconductor device 100C of yet another variant of the reference example 1.
Figure 22:
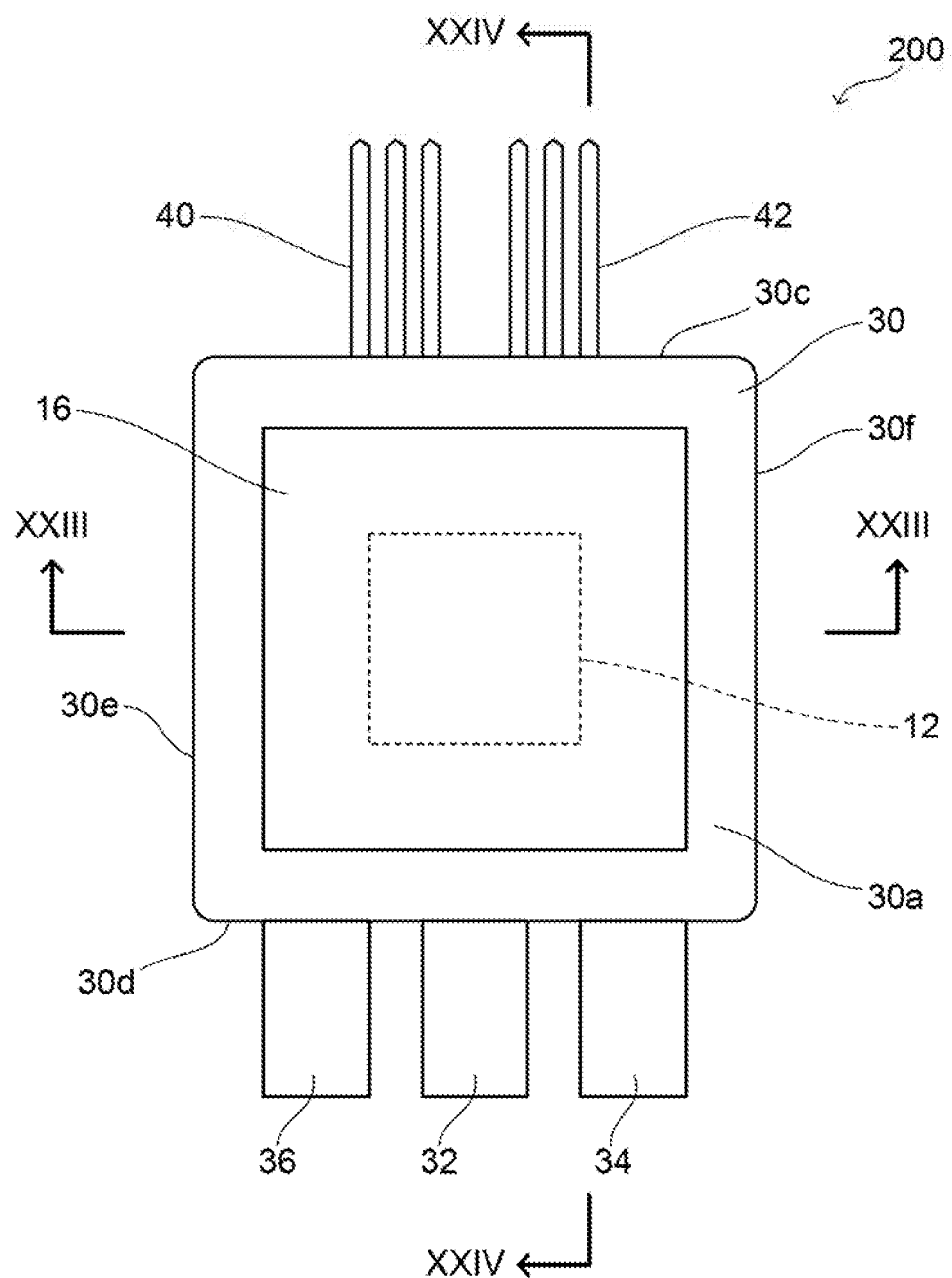
FIG. 22 shows an outer appearance of a semiconductor device 200 of a reference example 2 of the related technology.

FIG. 21 shows a semiconductor device 100C of a variant. As shown in FIG. 21, an area of a middle conductive plate 20 may be larger than an area of an upper conductive plate 16 and/or an area of a lower conductive plate IS. According to such a configuration, the middle conductive plate 20 located between the upper conductive plate 16 and the lower conductive plate 18 partially protrude from between the upper conductive plate 16 and the lower conductive plate 18. As such, for example, when the semiconductor device 100C is to be manufactured, the middle conductive plate 20 can easily be held together with the upper conductive plate 16 and/or the lower conductive plate 18 by a common jig. The area of the upper conductive plate 16 and the area of the lower conductive plate 18 may be equal to each other, or may be different from each other.

Reference Example 2 of Related Technology

A reference example 2 of the related technology will be described with reference to FIGS. 22 to 30. Constituent features in common or corresponding to those of the semiconductor device 10 of the aforementioned embodiment will be given the same reference signs and overlapping descriptions thereof will suitably be omitted. As shown in FIGS. 22 to 25, a semiconductor device 200 of the reference example 2 is also provided with an upper conductive plate 16, a middle conductive plate 20, and a lower conductive plate 18 stacked on each other, a first semiconductor chip 12 located between the upper conductive plate 16 and the middle conductive plate 20 and electrically connected to both the upper conductive plate 16 and the middle conductive plate 20, a second semiconductor chip 14 located between the middle conductive plate 20 and the lower conductive plate 18 and electrically connected to both the middle conductive plate 20 and the lower conductive plate 18, and an encapsulant 30 encapsulating the first semiconductor chip 12 and the second semiconductor chip 14 and integrally holding the upper conductive plate 16, the middle conductive plate 20, and the lower conductive plate 18.

Figure 23:
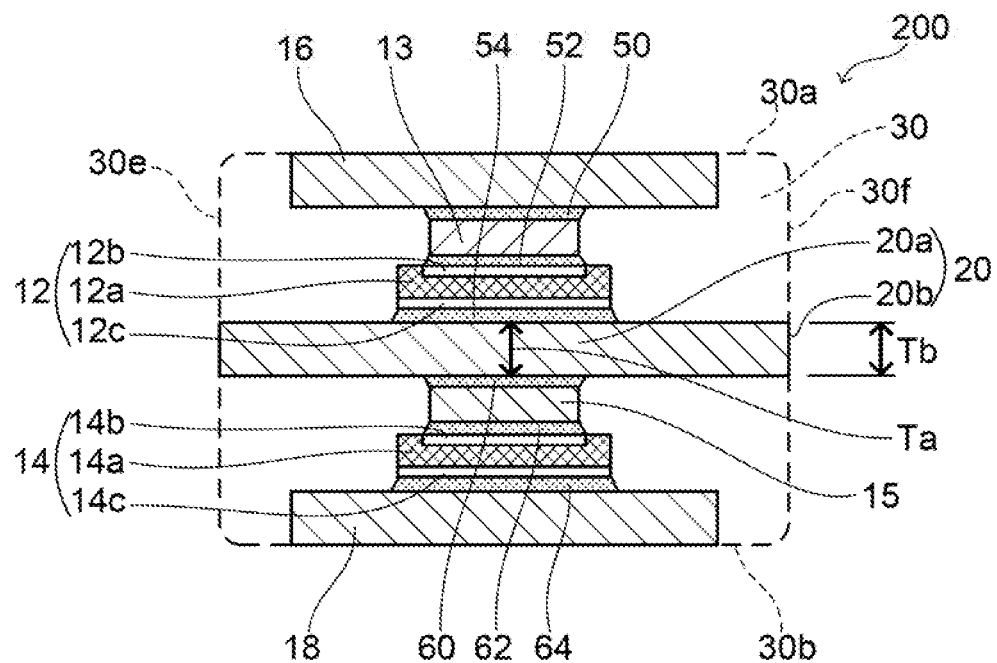
FIG. 23 shows a cross-sectional view along a line XXIII-XXIII of FIG. 22.
Figure 24:
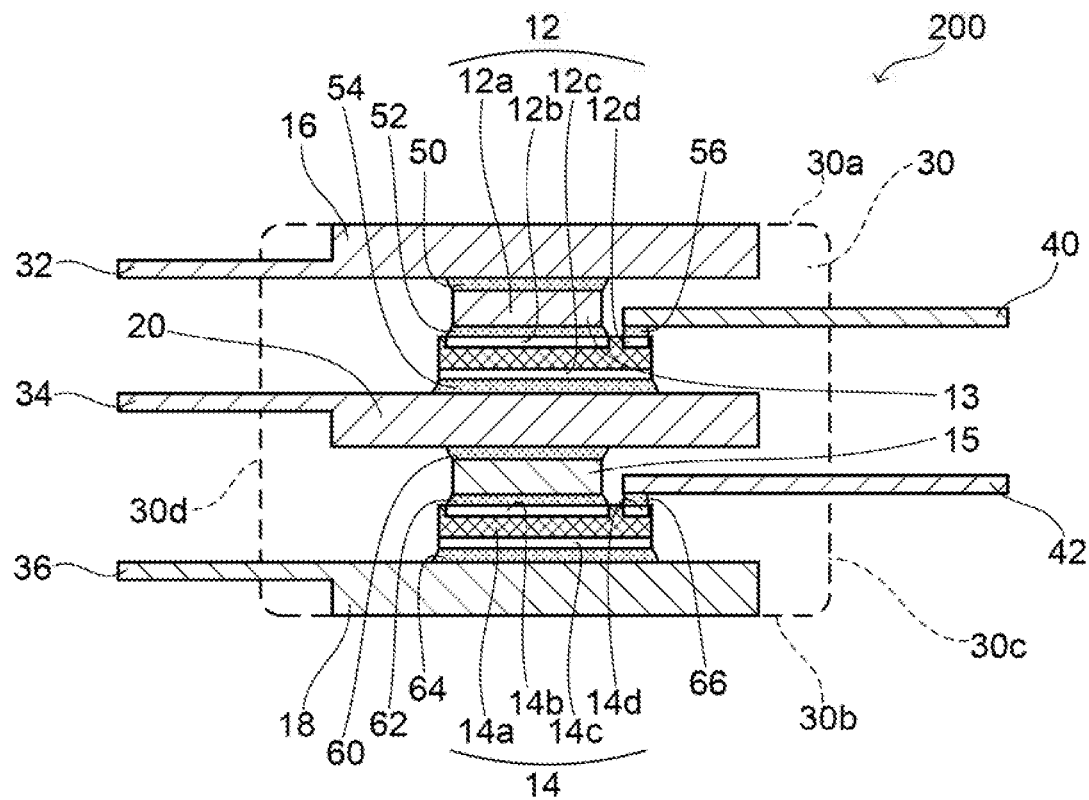
FIG. 24 shows a cross-sectional view along a line XXIV-XXIV of FIG. 22.
Figure 25:
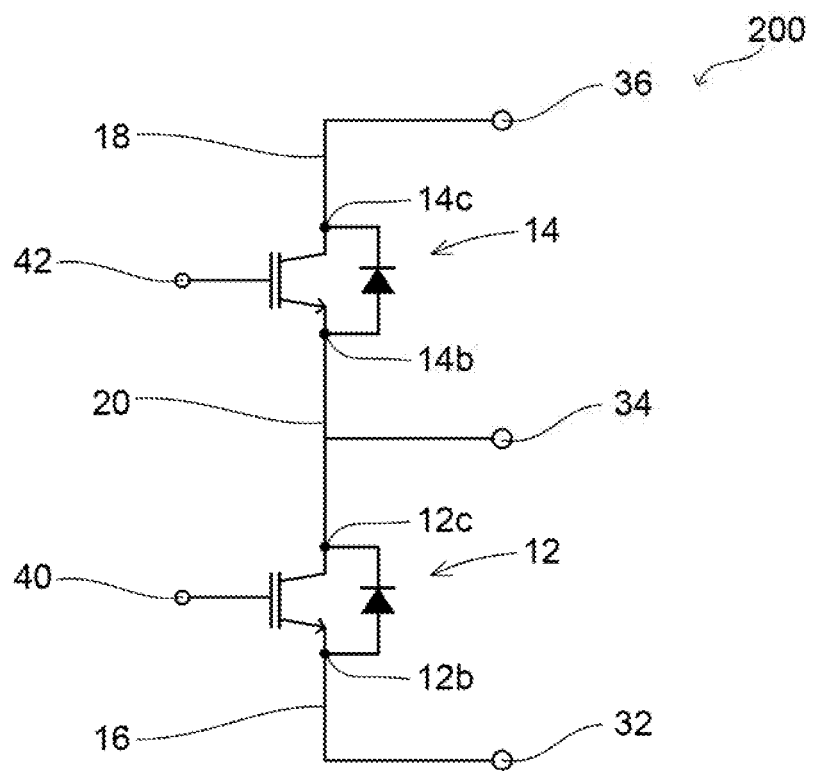
FIG. 25 shows a circuit structure of the semiconductor device 200 of the reference example 2.

In the semiconductor device 200 of the reference example 2, the middle conductive plate 20 is exposed outside on side surfaces 30e, 30f of the encapsulant 30 similar to the upper conductive plate 16 and the lower conductive plate IS, and can function as a heat dissipating plate. As shown in FIG. 23, the middle conductive plate 20 includes a main portion 20a joined to the first semiconductor chip 12 and the second semiconductor chip 14 within the encapsulant 30 and an exposed portion 20b exposed outside on the side surfaces 30e, 30f of the encapsulant 30. Further, a thickness Tb of the middle conductive plate 20 at the exposed portion 20b is equal to or larger than a thickness Ta of the middle conductive plate 20 at the main portion 20a.

The semiconductor device 200 of the reference example 2 is also employed in a power converter circuit such as a converter and an inverter, and can constitute a switching circuit configured to electrically flow and cut off current. When the current flows in the first semiconductor chip 12 and the second semiconductor chip 14, each of the first semiconductor chip 12 and the second semiconductor chip 14 generates heat. When the first semiconductor chip 12 and the second semiconductor chip 14 generate heat, temperatures of the three conductive plates 16, 18, 20 adjacent thereto also rise, and thermal expansion occurs in each of the conductive plates 16, 18, 20. Especially, the middle conductive plate 20 located between the first semiconductor chip 12 and the second semiconductor chip 14 tends to become hotter than the upper conductive plate 16 and the lower conductive plate 18.

Due to this, in the semiconductor device 200 of the reference example 2, the middle conductive plate 20 is exposed outside on the side surfaces 30e, 30f of the encapsulant 30 by which heat from the middle conductive plate 20 can easily be dissipated outside. Due to this, a temperature rise in the middle conductive plate 20 is effectively suppressed. Especially, the temperature rise in the middle conductive plate 20 is suppressed and both the first semiconductor chip 12 and the second semiconductor chip 14 can be cooled efficiently by arranging a cooler to be in contact with the exposed portion 20b of the middle conductive plate 20.

Figure 26:
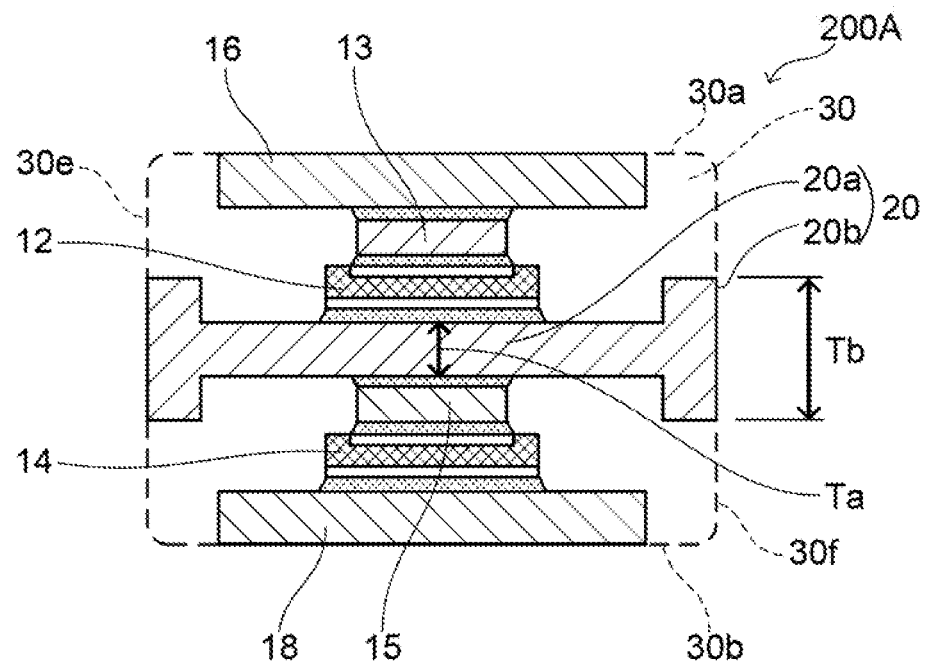
FIG. 26 shows a cross-sectional view schematically showing a configuration of a semiconductor device 200A of a variant of the reference example 2.

FIG. 26 shows a semiconductor device 200A of a variant of the reference example 2. As shown in FIG. 26, a thickness Tb of a middle conductive plate 20 at an exposed portion 20b may be sufficiently larger than a thickness Ta of the middle conductive plate 20 at a main portion 20a. In this case, the thickness Tb of the exposed portion 20b may be twice or larger than the thickness Ta of the main portion 20a. According to this configuration, a temperature rise in the middle conductive plate 20 can further be suppressed. In addition, a shape of the middle conductive plate 20 may be symmetric in a stacking direction of the three conductive plates 16, 18, 20 (vertical direction in FIG. 5). According to such a configuration, a temperature difference between a first semiconductor chip 12 and a second semiconductor chip 14 can be made small. The temperature rise in the middle conductive plate 20 can further be suppressed.

Figure 27:
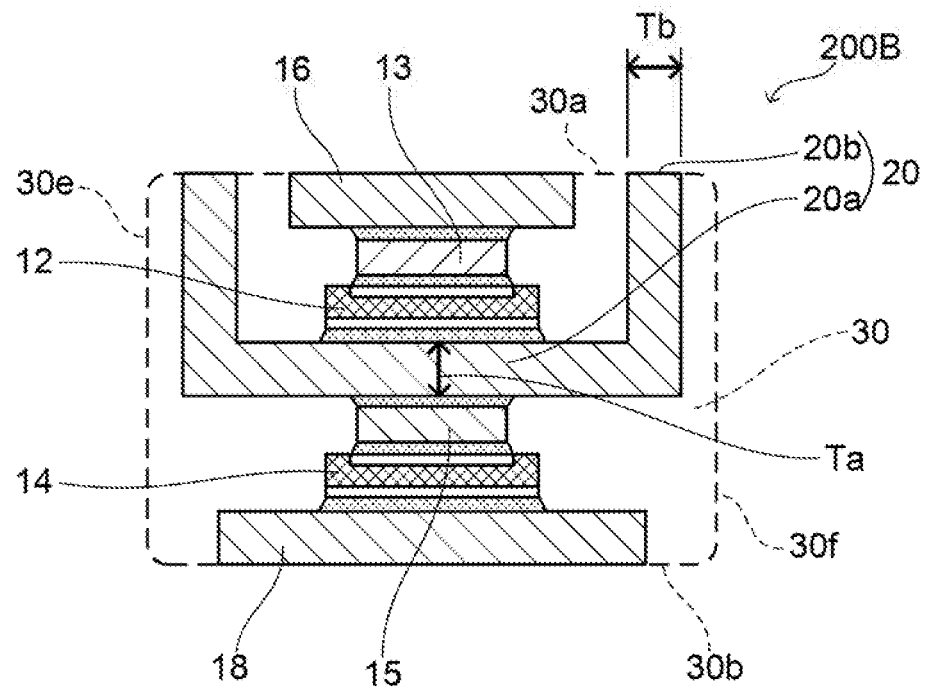
FIG. 27 shows a cross-sectional view schematically showing a configuration of a semiconductor device 200B of a variant of the reference example 2.

FIG. 27 shows a semiconductor device 200B of another variant of the reference example 2. As shown in FIG. 27, an exposed portion 20b of a middle conductive plate 20 may be exposed outside on an upper surface 30a (or a lower surface 30b) of an encapsulant 30. That is, the exposed portion 20b of the middle conductive plate 20 may be exposed on a same surface of the encapsulant 30 as an upper conductive plate 16 or a lower conductive plate 18. According to such a configuration, the middle conductive plate 20 and one of the upper conductive plate 16 and the lower conductive plate 18 can simultaneously be cooled by arranging a cooler along the upper surface 30a or the lower surface 30b of the encapsulant 30.

Figure 28:
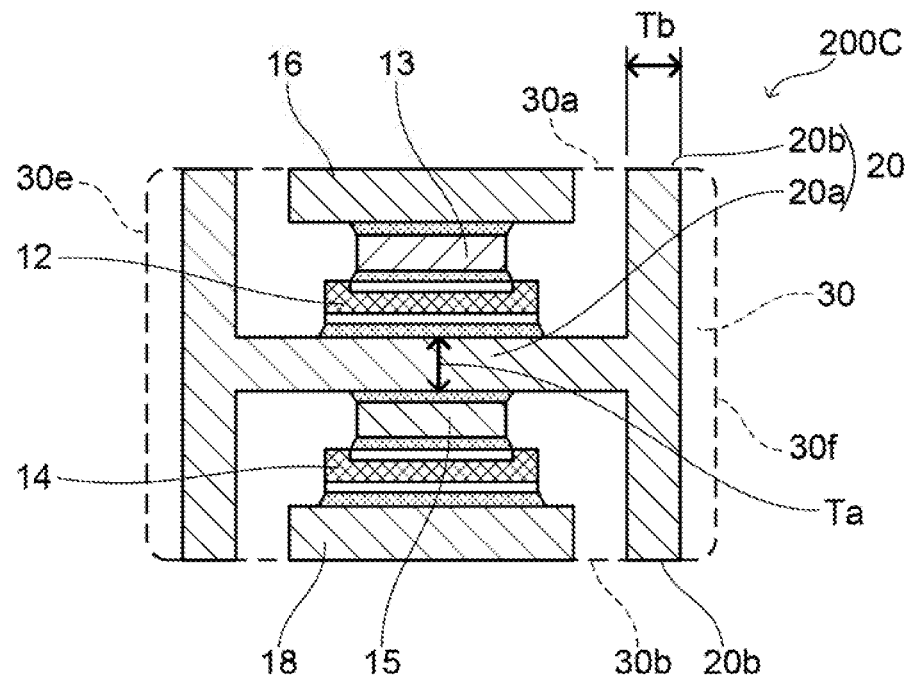
FIG. 28 shows a cross-sectional view schematically showing a configuration of a semiconductor device 200C of a variant of the reference example 2.

FIG. 28 shows a semiconductor device 200C of another variant of the reference example 2. As shown in FIG. 28, an exposed portion 20b of a middle conductive plate 20 may be exposed outside on both an upper surface 30a and a lower surface 30b of an encapsulant 30. According to such a configuration, the middle conductive plate 20 can efficiently be cooled by two coolers by arranging each cooler adjacent to corresponding one of the upper surface 30a and the lower surface 30b of the encapsulant 30.

Figure 29:
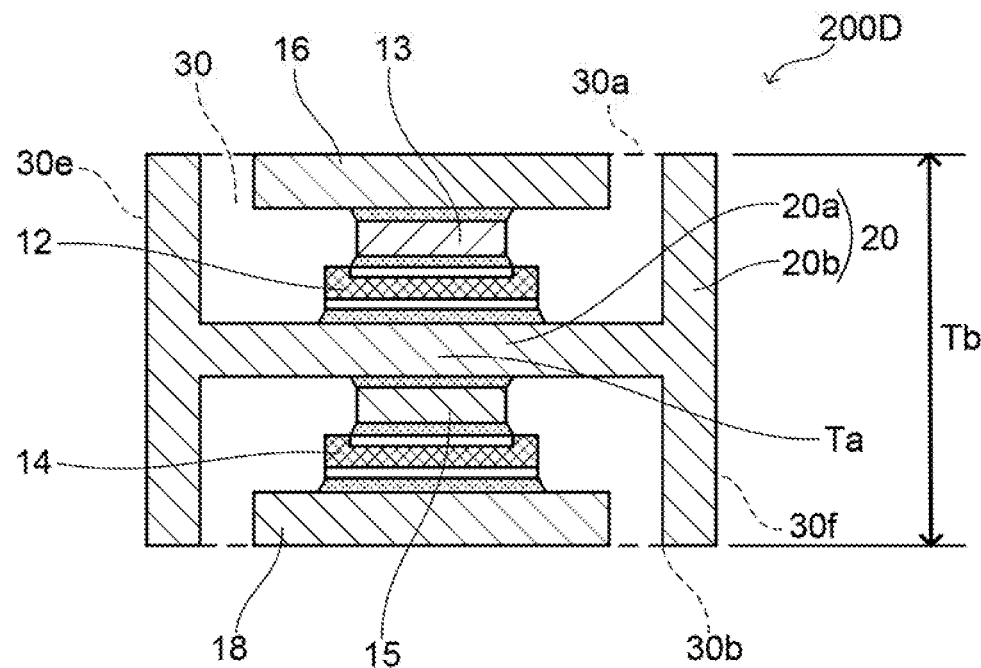
FIG. 29 shows a cross-sectional view schematically showing a configuration of a semiconductor device 200D of a variant of the reference example 2.

FIG. 29 shows a semiconductor device 200D of another variant of the reference example 2. As shown in FIG. 29, an exposed portion 20b of a middle conductive plate 20 may be exposed outside on each of side surfaces 30e, 30f, an upper surface 30a, and a lower surface 30b of an encapsulant 30. According to such a configuration, due to the middle conductive plate 20 being exposed outside by broader areas, a larger quantity of heat from the middle conductive plate 20 can be dissipated outside.

Figure 30:
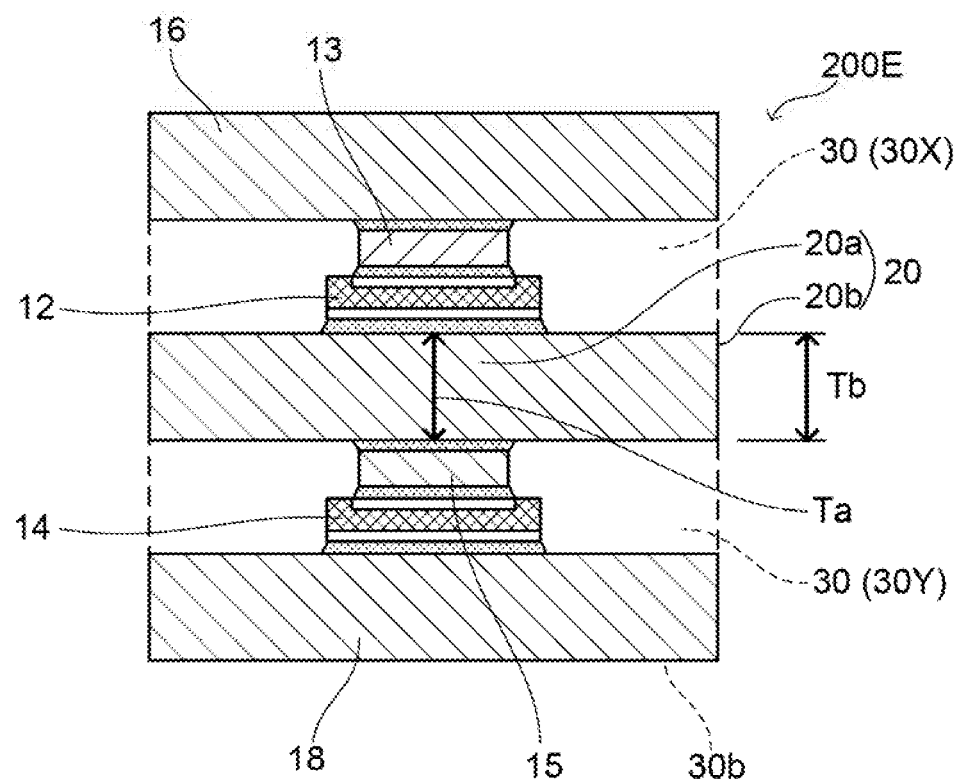
FIG. 30 shows a cross-sectional view schematically showing a configuration of a semiconductor device 200E of a variant of the reference example 2.
Figure 31:
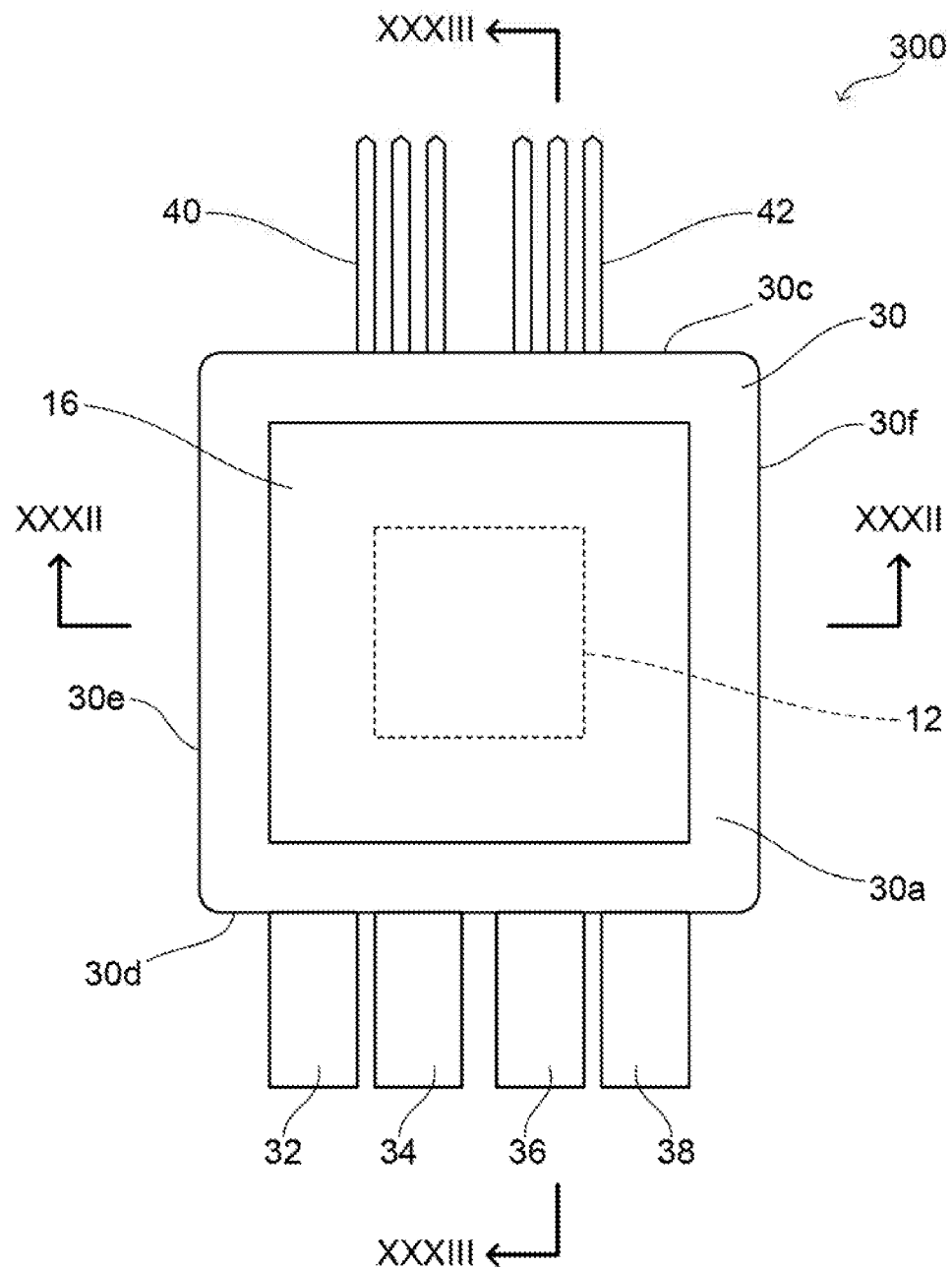
FIG. 31 shows an outer appearance of a semiconductor device 300 of a reference example 3 of the related technology.
Figure 32:
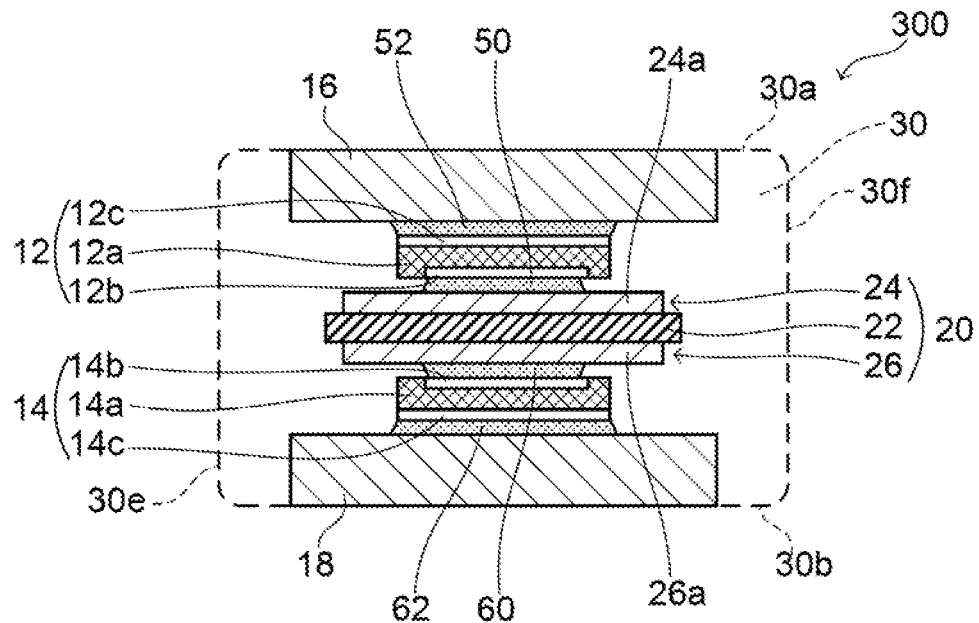
FIG. 32 shows a cross-sectional view along a line XXXII-XXXII of FIG. 31.
Figure 33:
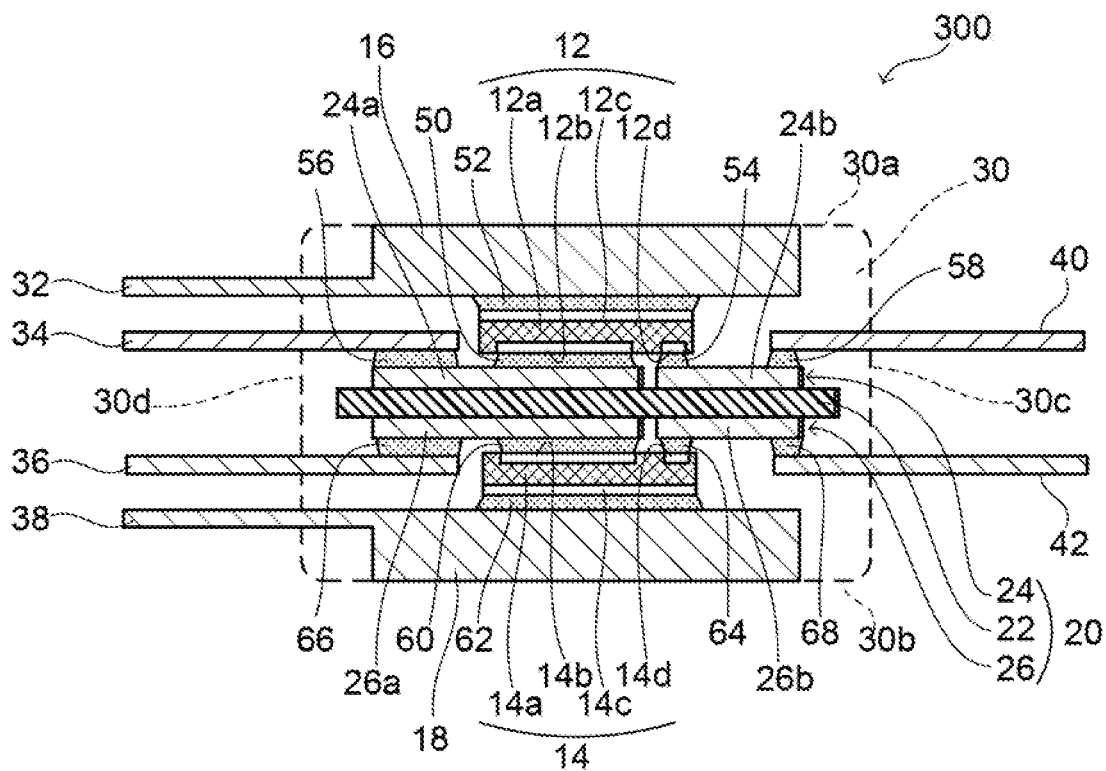
FIG. 33 shows a cross-sectional view along a line XXXIII-XXXIII of FIG. 31.
Figure 34:
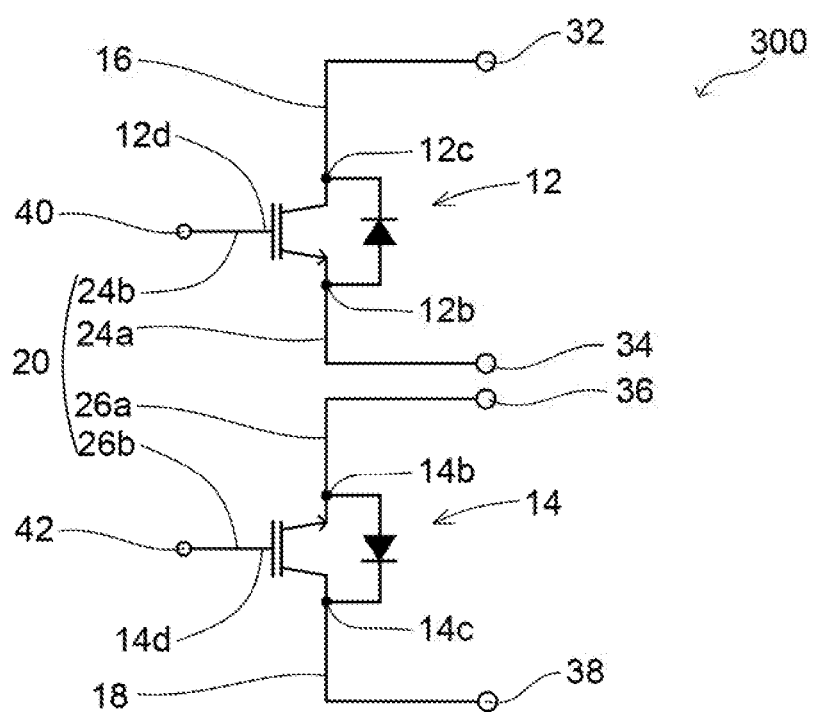
FIG. 34 shows a circuit structure of the semiconductor device 300 of the reference example 3.

FIG. 30 shows a semiconductor device 200E of another variant of the reference example 2. As shown in FIG. 30, an encapsulant 30 may be divided into a first encapsulant 30X and a second encapsulant 30Y by a middle conductive plate 20. The first encapsulant 30X is filled between an upper conductive plate 16 and the middle conductive plate 20 and encapsulates a first semiconductor chip 12. The second encapsulant 30Y is filled between the middle conductive plate 20 and a lower conductive plate 18 and encapsulates a second semiconductor chip 14. In this semiconductor device 200E as well, the middle conductive plate 20 includes a main portion 20a joined to the first semiconductor chip 12 and the second semiconductor chip 14 within the encapsulant 30 and an exposed portion 20b exposed outside on a surface of the encapsulant 30. Further, a thickness b of the exposed portion 20b of the middle conductive plate 20 is equal to or larger than a thickness Ta of the main portion 20a of the middle conductive plate 20.

Reference Example 3 of Related Technology

A reference example 3 of the related technology will be described with reference to FIGS. 31 to 39. Constituent features in common or corresponding to those of the semiconductor device 10 of the aforementioned embodiment will be given the same reference signs and overlapping descriptions thereof will suitably be omitted. As shown in FIGS. 31 to 34, a semiconductor device 300 of the reference example 3 is also provided with an upper conductive plate 16, a middle conductive plate 20, and a lower conductive plate 18 stacked on each other, a first semiconductor chip 12 located between the upper conductive plate 16 and the middle conductive plate 20 and electrically connected to both the upper conductive plate 16 and the middle conductive plate 20, a second semiconductor chip 14 located between the middle conductive plate 20 and the lower conductive plate 18 and electrically connected to both the middle conductive plate 20 and the lower conductive plate 18, and an encapsulant 30 encapsulating the first semiconductor chip 12 and the second semiconductor chip 14 and integrally holding the upper conductive plate 16, the middle conductive plate 20, and the lower conductive plate 18.

The upper conductive plate 16 and the lower conductive plate 18 are metal plates and are constituted of metal such as copper. The upper conductive plate 16 is joined to a second main electrode 12 of the first semiconductor chip 12 via a joint layer 52. The joint layer 52 may for example be a solder layer and electrically and thermally connects the upper conductive plate 16 and the first semiconductor chip 12. The upper conductive plate 16 is exposed outside on an upper surface 30a of the encapsulant 30. As such, the upper conductive plate 16 not only constitutes a part of an electrical circuit connected to the first semiconductor chip 12, but also functions as a heat dissipating plate for dissipating heat from the first semiconductor chip 12 to outside. The lower conductive plate 18 is joined to a second main electrode 14c of the second semiconductor chip 14 via a joint layer 62. The joint layer 62 may also be a solder layer, for example, and electrically and thermally connects the lower conductive plate 18 and the second semiconductor chip 14. The lower conductive plate 18 is exposed outside on a lower surface 30b of the encapsulant 30. As such, the lower conductive plate 18 not only constitutes a part of an electrical circuit connected to the second semiconductor chip 14, but also functions as a heat dissipating plate for dissipating heat from the second semiconductor chip 14 to outside.

The middle conductive plate 20 has a stacked structure including an insulator substrate 22, a first metal layer 24, and a second metal layer 26. The insulator substrate 22 is a substrate constituted of an insulator, and may for example be a ceramic substrate. The first metal layer 24 is constituted of metal such as copper, and is provided on an upper surface of the insulator substrate 22. The second metal layer 26 is also constituted of metal such as copper, and is provided on a lower surface of the insulator substrate 22. The first metal layer 24 is electrically connected to the first semiconductor chip 12 and the second metal layer 26 is electrically connected to the second semiconductor chip 14. Although not particularly limited, the middle conductive plate 20 may be a Direct Bonded Copper (DBC) substrate or a Direct Bonded Aluminum (DBA) substrate or Active Metal Brazed Copper (AMC) substrate.

The first metal layer 24 of the middle conductive plate 20 includes a first main circuit unit 24a and a plurality of first signal circuit units 24b. The first main circuit unit 24a and the plurality of first signal circuit units 24b are separated from each other, and are electrically insulated from each other. The first main circuit unit 24a is joined to a first main electrode 12b of the first semiconductor chip 12 via a joint layer 50. The joint layer 50 may for example be a solder layer and electrically and thermally connects the first main circuit unit 24a and the first main electrode 12b of the first semiconductor chip 12. The plurality of first signal circuit units 24b is joined respectively to a plurality of signal electrodes 12d of the first semiconductor chip 12 via joint layers 54. These joint layers 54 may also be solder layers and electrically and thermally connect the plurality of first signal circuit units 24b and the plurality of signal electrodes 12d of the first semiconductor chip 12.

Similarly, the second metal layer 26 of the middle conductive plate 20 includes a second main circuit unit 26a and a plurality of second signal circuit units 26b. The second main circuit unit 26a and the plurality of second signal circuit units 26b are separated from each other, and are electrically insulated from each other. The second main circuit unit 26a is joined to a first main electrode 14b of the second semiconductor chip 14 via a joint layer 60. The joint layer 60 may for example be a solder layer and electrically and thermally connects the second main circuit unit 26a and the first main electrode 14b of the second semiconductor chip 14. The plurality of second signal circuit units 26b is joined respectively to a plurality of signal electrodes 14d of the second semiconductor chip 14 via joint layers 64. These joint layers 64 may also be solder layers and electrically and thermally connect the plurality of second signal circuit units 26b and the plurality of signal electrodes 14d of the second semiconductor chip 14.

The semiconductor device 300 comprises a plurality of power terminals 32, 34, 36, 38 and pluralities of signal terminals 40, 42. Although not particularly limited, these terminals 32, 34, 36, 38, 40, 42 are constituted of metal such as copper. The plurality of power terminals 32, 34, 36, 38 protrudes from a second end surface 30d of the encapsulant 30. The pluralities of signal terminals 40, 42 protrude from a first end surface 30c of the encapsulant 30. However, specific structures such as positions and shapes of these terminals 32, 34, 36, 38, 40, 42 are not particularly limited.

The plurality of power terminals 32, 34, 36, 38 includes a first power terminal 32, a second power terminal 34, a third power terminal 36, and a fourth power terminal 38. The first power terminal 32 is electrically connected to the upper conductive plate 16 within the encapsulant 30. Due to this, the second main electrode 12c of the first semiconductor chip 12 is electrically connected to the first power terminal 32 via the upper conductive plate 16. Although not particularly limited, the first power terminal 32 may be integrally configured with the upper conductive plate 16. The second power terminal 34 is electrically connected to the first main circuit unit 24a of the first metal layer 24 of the middle conductive plate 20 within the encapsulant 30. Due to this, the first main electrode 12b of the first semiconductor chip 12 is electrically connected to the second power terminal 34 via the first main circuit unit 24a of the middle conductive plate 20. Although not particularly limited, the second power terminal 34 may be joined to the first main circuit unit 24a via a joint layer 56 such as a solder layer.

The third power terminal 36 is electrically connected to the second main circuit unit 26a of the second metal layer 26 of the middle conductive plate 20 within the encapsulant 30. Due to this, the first main electrode 14b of the second semiconductor chip 14 is electrically connected to the third power terminal 36 via the second main circuit unit 26e of the middle conductive plate 20. Although not particularly limited, the third power terminal 36 may be joined to the second main circuit unit 26a via a joint layer 66 such as a solder layer. The fourth power terminal 38 is electrically connected to the lower conductive plate 18 within the encapsulant 30. Due to this, the second main electrode 14c of the second semiconductor chip 14 is electrically connected to the fourth power terminal 38 via the lower conductive plate 18. Although not particularly limited, the fourth power terminal 38 may be integrally configured with the lower conductive plate 18.

The pluralities of signal terminals 40, 42 include a plurality of first signal terminals 40 and a plurality of second signal terminals 42. The plurality of first signal terminals 40 is electrically connected respectively to the plurality of first signal circuit units 24b of the first metal layer 24 of the middle conductive plate 20 within the encapsulant 30. Due to this, each of the signal electrodes 12d of the first semiconductor chip 12 is electrically connected to corresponding one of the first signal terminals 40 via the corresponding first signal circuit unit 24b. Although not particularly limited, the plurality of first signal terminals 40 may be joined respectively to the plurality of first signal circuit units 24b via joint layers 58 such as solder layers. Similarly, the respective second signal terminals 42 are electrically connected to the plurality of second signal circuit units 26b of the second metal layer 26 of the middle conductive plate 20 within the encapsulant 30. Due to this, each of the signal electrodes 14d of the second semiconductor chip 14 is electrically connected to corresponding one of the second signal terminals 42 via the corresponding second signal circuit unit 26b. Although not particularly limited, for the plurality of second signal terminals 42 as well, they may respectively be joined to the plurality of second signal circuit units 26b via joint layers 68 such as solder layers.

According to the above configuration, the semiconductor device 300 of the reference example 3 is employed in a power converter circuit such as a converter and an inverter, and can constitute a switching circuit configured to electrically flow and cut off current. In this ca, when the second power terminal 34 and the fourth power terminal 38 are connected to each other, the first semiconductor chip 12 and the second semiconductor chip 14 can be connected in series. Alternatively, when the first power terminal 32 and the fourth power terminal 38 are connected to each other and the second power terminal 34 and the third power terminal 36 are connected to each other, the first semiconductor chip 12 and the second semiconductor chip 14 can be connected in parallel.

When the current flows in the first semiconductor chip 12 and the second semiconductor chip 14, each of the first semiconductor chip 12 and the second semiconductor chip 14 generates heat. When the first semiconductor chip 12 and the second semiconductor chip 14 generate heat, temperatures of the three conductive plates 16, 18, 20 adjacent thereto also rise, and thermal expansion occurs in each of the conductive plates 16, 18, 20. Especially, the middle conductive plate 20 located between the first semiconductor chip 12 and the second semiconductor chip 14 tends to become hotter than the upper conductive plate 16 and the lower conductive plate 18.

Due to this, in the semiconductor device 300 of the reference example 3, the middle conductive plate 20 has the stack structure including the insulator substrate 22 whereas the upper conductive plate 16 and the lower conductive plate 18 are the metal plates. The insulator substrate 22 is for example a ceramic substrate, and a material constituting the insulator substrate 22 has a smaller linear expansion coefficient than a material constituting the first metal layer 24 and a material constituting the second metal layer 26. Due to this, a linear expansion coefficient in an in-plane direction of the middle conductive plate 20 is smaller than a linear expansion coefficient in an in-plane direction of the upper conductive plate 16 and a linear expansion coefficient in an in-plane direction of the lower conductive plate 18. As such, even when the temperature of the middle conductive plate 20 becomes higher than the temperature of the upper conductive plate 16 and the temperature of the lower conductive plate 18, uneven thermal expansion is suppressed from occurring in the three conductive plates 16, 18, 20.

Here, the middle conductive plate 20 is not limited to the stack structure including the insulator substrate 22, and a structure and a material thereof may suitably be changed. Similarly, the upper conductive plate 16 and the lower conductive plate 18 are not limited to the metal plates, and structures and materials thereof may suitably be changed. The structures and materials of the three conductive plates 16, 18, 20 may be modified in various configurations so long as the linear expansion coefficient in the in-plane direction of the middle conductive plate 20 is smaller than the linear expansion coefficient in the in-plane direction of the upper conductive plate 16 and the linear expansion coefficient in the in-plane direction of the lower conductive plate 18.

Figure 35:
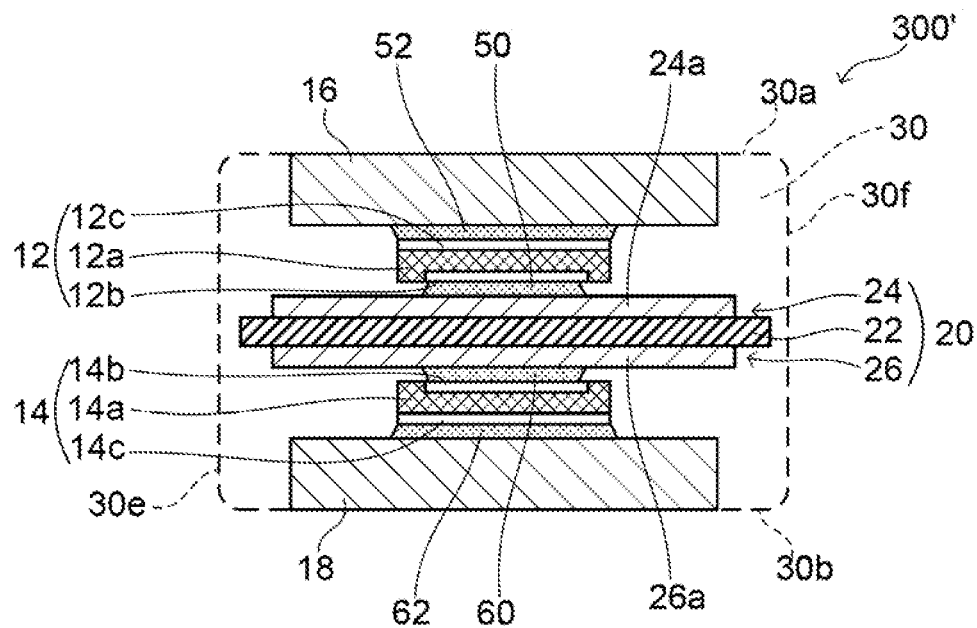
FIG. 35 shows a cross-sectional view schematically showing a configuration of a semiconductor device 300' of a variant of the reference example 3.
Figure 36:
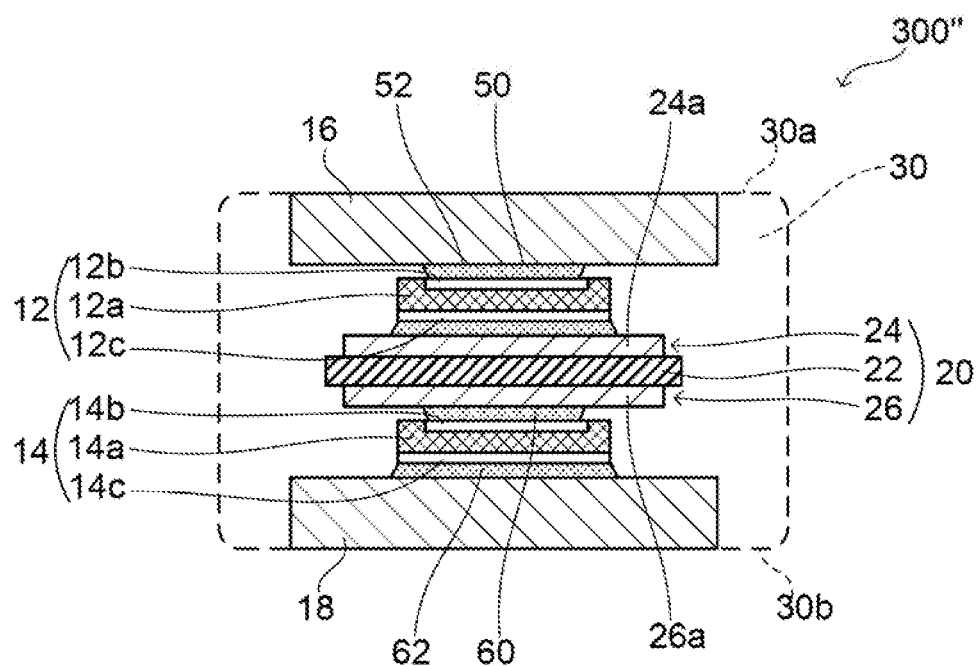
FIG. 36 shows a cross-sectional view schematically showing a configuration of a semiconductor device 300" of a variant of the reference example 3.

In the semiconductor device 300 of the reference example 3, an area of the middle conductive plate 20 is smaller than an area of the upper conductive plate 16 and an area of the lower conductive plate 18. In other words, the area of the upper conductive plate 16 and the area of the lower conductive plate 18 are larger than the area of the middle conductive plate 20. As aforementioned, the upper conductive plate 16 and the lower conductive plate 18 are exposed outside on the upper surface 30a or the lower surface 30b of the encapsulant 30, and function as the heat dissipating plates. Due to this, when the area of the upper conductive plate 16 and the area of the lower conductive plate 18 are large, the heat from each of the semiconductor chips 12, 14 is efficiently dissipated to outside of the semiconductor device 300 through the upper conductive plate 16 and the lower conductive plate 18. However, as shown in FIG. 35, in a semiconductor device 300' of a variant of the reference example 3, an area of a middle conductive plate 20 may be larger than an area of an upper conductive plate 16 and an area of a lower conductive plate 18. According to such a configuration, a thermal capacity of the middle conductive plate 20 is increased, by which a temperature rise in the middle conductive plate 20 can be suppressed.

In the semiconductor device 300 of the reference example 3, both the first semiconductor chip 12 and the second semiconductor chip 14 are electrically connected to the middle conductive plate 20 by their first main electrodes 12b, 14b and are electrically connected to the upper conductive plate 16 or the lower conductive plate 18 by their second main electrodes 12c, 14c. As aforementioned, an area of each of the second main electrodes 12c, 14c is larger than an area of each of the first main electrodes 12b, 14b. As such, each of the semiconductor chips 12, 14 dissipates the heat at a larger quantity through the corresponding second main electrode 12c, 14c than through the corresponding first main electrode 12b, 14b. Further, the temperature of the middle conductive plate 20 tends to increase easily due to receiving the heat from both the first semiconductor chip 12 and the second semiconductor chip 14. Due to this, the temperature rise in the middle conductive plate 20 can be suppressed by having both the first semiconductor chip 12 and the second semiconductor chip 14 connected to the middle conductive plate 20 by their first main electrodes 12b, 14b having a smaller heat dissipating amount. Alternatively, as in a semiconductor device 300" of another variant shown in FIG. 36, only a second semiconductor chip 14 (or a first semiconductor chip 12) may be connected to a middle conductive plate 20 at its corresponding first main electrode 12b, 14b.

Figure 37:
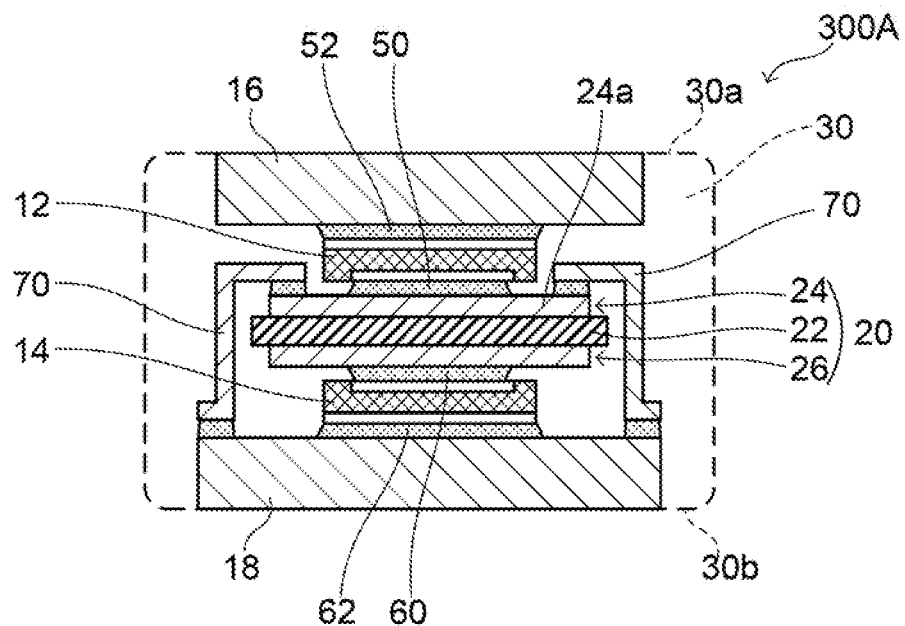
FIG. 37 shows a cross-sectional view schematically showing a configuration of a semiconductor device 300A of another variant of the reference example 3, and corresponds to the cross-sectional view of FIG. 32.
Figure 38:
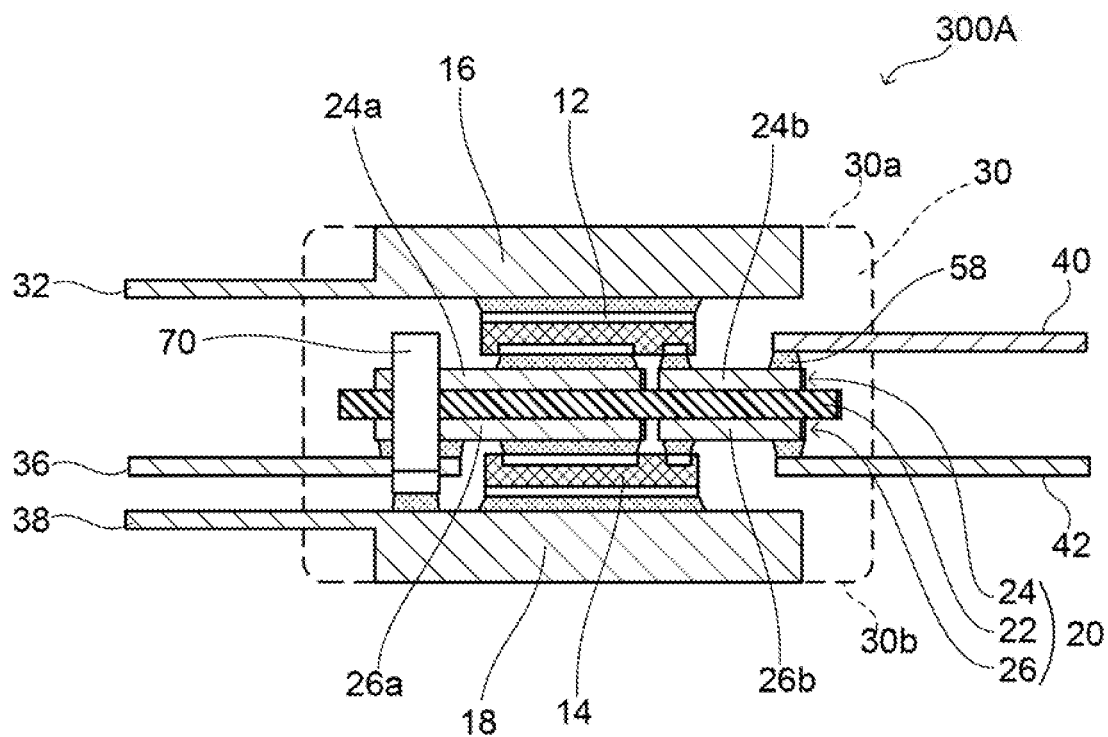
FIG. 38 shows a cross-sectional view schematically showing the configuration of the semiconductor device 300A of the other variant of the reference example 3, and corresponds to the cross-sectional view of FIG. 33.
Figure 39:
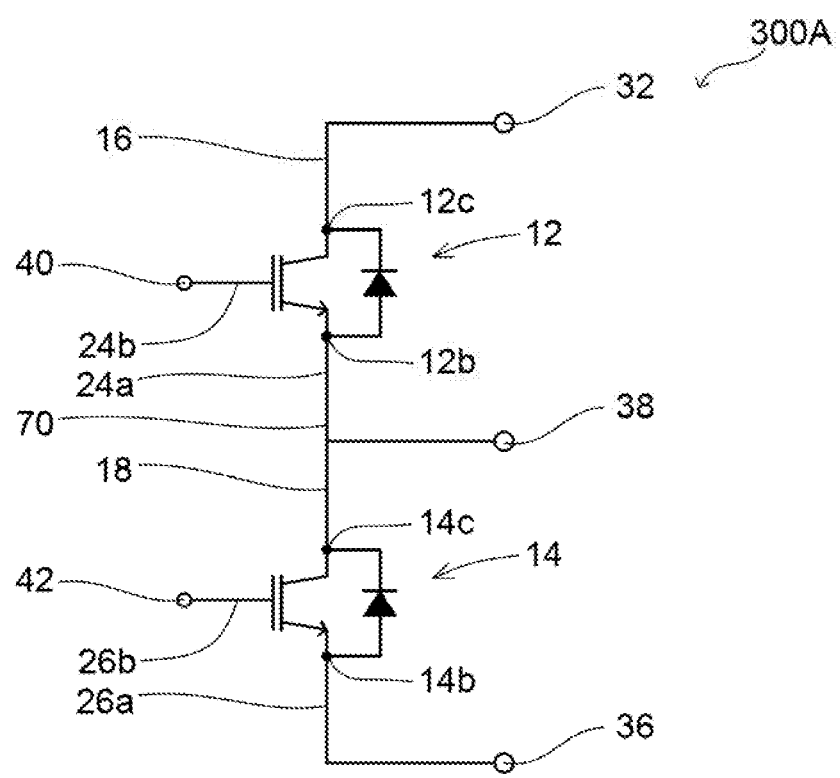
FIG. 39 shows a circuit structure of the semiconductor device 300A of the variant shown in FIGS. 37 and 38.

A semiconductor device 300A of a variant of the reference example 3 will be described with reference to FIGS. 37 to 39. The semiconductor device 300A of this variant further comprises two joint members 70, and differs from the aforementioned semiconductor device 300 of the reference example 3 in this regard. Further, the semiconductor device 300A of the present variant does not have a second power terminal 34, and differs from the semiconductor device 300 of the reference example 3 also in this regard. Other configurations of the semiconductor device 300A of the present variant are in common or correspond to those of the semiconductor device 300 of the reference example 3. As such, in FIGS. 37 to 39, constituent features in common or corresponding to those of the semiconductor device 300 of the reference example 3 will be given the same reference signs and overlapping descriptions thereof will herein be omitted.

Each of the joint members 70 is located within an encapsulant 30, and is constituted of a conductor such as metal. One ends of the joint members 70 are connected to a first main circuit unit 24a of a first metal layer 24 of a middle conductive plate 20. Other ends of the joint members 70 are connected to a lower conductive plate 18. Due to this, the first main circuit unit 24a of the middle conductive plate 20 is electrically connected to the lower conductive plate 18 via the respective joint members 70. According to such a configuration, a first semiconductor chip 12 and a second semiconductor chip 14 can be connected in series within the encapsulant 30 as shown in FIG. 39. As such, the second power terminal 34 is omitted. A fourth power terminal 38 may be omitted instead of the second power terminal 34.

The semiconductor device 300A of the present variant comprises the two joint members 70, however, a number of the joint member(s) 70 is not limited to two. The semiconductor device 300A may comprise a single joint member 70 or three or more joint members 70. Further, by changing a position where each joint member 70 is connected, the first semiconductor chip 12 and the second semiconductor chip 14 may be connected in parallel within the encapsulant 30.

What is claimed is:

1. A semiconductor device comprising:
    an upper conductive plate, a middle conductive plate, and a lower conductive plate that are stacked on each other;
    a first semiconductor chip located between the upper conductive plate and the middle conductive plate and electrically connected to both the upper conductive plate and the middle conductive plate; and
    a second semiconductor chip located between the middle conductive plate and the lower conductive plate and electrically connected to both the middle conductive plate and the lower conductive plate,
    wherein, in a plan view along a stacking direction,
    one of an area of the upper conductive plate and an area of the lower conductive plate is smaller than an area of the middle conductive plate and is larger than an area of the first semiconductor chip and an area of the second semiconductor chip, and
    another of the area of the upper conductive plate and the area of the lower conductive plate is larger than the area of the middle conductive plate.

2. The semiconductor device according to claim 1, wherein
    each of the first semiconductor chip and the second semiconductor chip comprises a first main electrode and a second main electrode which has a larger area than the first main electrode,
    the first semiconductor chip is connected to the upper conductive plate by the first main electrode and is connected to the middle conductive plate by the second main electrode, and
    the second semiconductor chip is connected to the middle conductive plate by the first main electrode and is connected to the lower conductive plate by the second main electrode.

3. The semiconductor device according to claim 2, wherein
    the area of the upper conductive plate is smaller than the area of the middle conductive plate, and
    the area of the lower conductive plate is larger than the area of the middle conductive plate.

4. The semiconductor device according to claim 2, wherein
    the area of the upper conductive plate is larger than the area of the middle conductive plate, and
    the area of the lower conductive plate is smaller than the area of the middle conductive plate.

5. The semiconductor device according to claim 1, wherein
    a thickness of one of the upper conductive plate and the lower conductive plate is larger than a thickness of another of the upper conductive plate and the lower conductive plate.

6. The semiconductor device according to claim 1, further comprising an encapsulant encapsulating the first semiconductor chip and the second semiconductor chip and integrally holding the upper conductive plate, the middle conductive plate, and the lower conductive plate.

* * * * *